US012499802B2

(12) United States Patent
Chen et al.

(10) Patent No.: US 12,499,802 B2
(45) Date of Patent: Dec. 16, 2025

(54) SHIFT REGISTER, GATE DRIVING CIRCUIT, PANEL, CONTROL METHOD AND DRIVING APPARATUS

(71) Applicant: Xiamen Tianma Microelectronics Co., Ltd., Xiamen (CN)

(72) Inventors: Huiying Chen, Xiamen (CN); Zongjun Zou, Xiamen (CN); Changzhi Wu, Xiamen (CN); Yumin Xu, Xiamen (CN)

(73) Assignee: Xiamen Tianma Microelectronics Co., Ltd., Xiamen (CN)

( * ) Notice: Subject to any disclaimer, the term of this patent is extended or adjusted under 35 U.S.C. 154(b) by 0 days.

(21) Appl. No.: 18/912,630

(22) Filed: Oct. 11, 2024

(65) Prior Publication Data

US 2025/0364067 A1 Nov. 27, 2025

(30) Foreign Application Priority Data

May 27, 2024 (CN) ......................... 202410667003.4

(51) Int. Cl.
*G09G 3/32* (2016.01)
*G11C 19/28* (2006.01)

(52) U.S. Cl.
CPC ............... *G11C 19/28* (2013.01); *G09G 3/32* (2013.01); *G09G 2300/0408* (2013.01); *G09G 2310/0267* (2013.01); *G09G 2310/0286* (2013.01); *G09G 2330/04* (2013.01)

(58) Field of Classification Search
CPC ... G09G 3/32–3291; G09G 2300/0408; G09G 2300/0421; G09G 2300/0426; G09G 2310/0243–0251; G09G 2310/0264; G09G 2310/0267; G09G 2310/0286; G09G 2320/0233; G09G 2320/0242; G09G 2320/04; G09G 2330/04; G11C 19/28
See application file for complete search history.

(56) References Cited

U.S. PATENT DOCUMENTS

| | | | | |
|---|---|---|---|---|
| 2006/0017672 | A1* | 1/2006 | Aoki | G09G 3/325 345/77 |
| 2014/0049532 | A1* | 2/2014 | Choi | G09G 5/00 345/213 |
| 2016/0300536 | A1* | 10/2016 | Li | G09G 3/344 |
| 2019/0266971 | A1* | 8/2019 | Hao | G09G 3/3677 |
| 2020/0168285 | A1* | 5/2020 | Chen | G11C 19/28 |
| 2022/0068190 | A1* | 3/2022 | Feng | G09G 3/2092 |

FOREIGN PATENT DOCUMENTS

| | | | |
|---|---|---|---|
| CN | 111415695 | A | 7/2020 |
| CN | 115244603 | A | 10/2022 |
| CN | 115578979 | A | 1/2023 |

* cited by examiner

*Primary Examiner* — Nathan Danielsen
(74) *Attorney, Agent, or Firm* — East IP P.C.

(57) ABSTRACT

Embodiments of the present application provides a shift register, a gate driving circuit, a panel, a control method and a driving apparatus, the shift register comprises: an output control module, a full screen reset module, a cascade output module and an output module; the output control module is configured to turn on when there is no electrostatic discharge in the shift register so that the first gate signal output terminal outputs a target signal; the cascade output module is configured to provide the first voltage signal or the second voltage signal to the second gate signal output terminal when there is electrostatic discharge in the shift register.

20 Claims, 14 Drawing Sheets

SHIFT REGISTER, GATE DRIVING CIRCUIT, PANEL, CONTROL METHOD AND DRIVING APPARATUS

CROSS-REFERENCE TO RELATED APPLICATION

The present application claims priority to Chinese Patent Application No. 202410667003.4 filed on May 27, 2024, and titled “SHIFT REGISTER, GATE DRIVING CIRCUIT, PANEL, CONTROL METHOD AND DRIVING APPARATUS”, which is incorporated herein by reference in its entirety.

TECHNICAL FIELD

The present application relates to the technical field of display technology, and in particular to a shift register, a gate driving circuit, a panel, a method for controlling a shift register and a shift register driving apparatus.

BACKGROUND

In a flat panel display panel, a gate driving circuit is usually configured to provide a gate turn-on signal to the gate of each thin film transistor (TFT) in the pixel area. The gate driving circuit can be formed on the array substrate of the flat panel display panel by means of an array process, namely, Gate Driver on Array, GOA process. This integrated process not only saves costs, but also reduces the bonding area of the gate integrated circuit (IC) and the wiring space of the Fan-out, thereby realizing a narrow frame design.

The existing gate driving circuit is composed of multiple cascaded shift registers: SR(1), SR(2) . . . SR(n), SR(n+1) . . . SR(N−1), SR(N) (a total of N shift registers, wherein 1≤n≤ N), and each shift register SR(n) is configured to provide a gate turn-on signal to the gate line connected with the signal output terminal Output_n of this shift register SR(n) to turn on the TFT of the pixel area of the corresponding row.

Currently, display panels are susceptible to ESD (electrostatic discharge) interference, which can cause abnormal split-screen display.

SUMMARY

The main purpose of the present application is to provide a shift register, a gate driving circuit, a panel, a method for controlling a shift register and a shift register driving apparatus, so as to at least solve the problem in the prior art that when static electricity is released in a certain row of display screen, the output signal of this row will affect the input signal of the next row.

In order to achieve the above-mentioned purpose, an embodiment of the present application provides a shift register, comprising: an output control module, a full screen reset module, a cascade output module and an output module that are electrically connected, wherein

- the output control module is configured to turn on when there is no electrostatic discharge in the shift register to transmit a signal of a first node to a second node so that a first gate signal output terminal outputs a target signal configured to drive a current row of display element to display or not display, or the output control module is configured to turn off when there is electrostatic discharge in the shift register;
- the full screen reset module is configured to reset the potential of the second node and the potential of the first gate signal output terminal when there is electrostatic discharge in the shift register, the first gate signal output terminal not outputting any signal when the output control module is turned off and the second node and the first gate signal output terminal are in a reset state;
- the cascade output module is configured to provide a first voltage signal to a second gate signal output terminal under the control of a first driving signal when there is electrostatic discharge in the shift register, or the cascade output module is configured to provide a second voltage signal to a second gate signal output terminal under the control of a second driving signal, a signal output by the second gate signal output terminal being configured to drive a next row of display element to display or not display;
  - the output module is configured to provide a signal of a first clock signal terminal to the first gate signal output terminal under the control of a signal of the second node, or the output module is configured to provide a signal of a first reference voltage terminal to the first gate signal output terminal under the control of a signal of a third node, or the output module is configured not to output any signal when the output control module is turned off.

According to another aspect of the present application, a gate driving circuit is provided, comprising: a plurality of shift registers that are cascaded, wherein the shift register is any one of the shift registers described above.

According to another aspect of the present application, a panel is provided, comprising: an array substrate and an oppose substrate arranged opposite to each other, the array substrate comprising a base substrate and any one of the shift registers above located on the base substrate.

According to another aspect of the present application, a method for controlling a shift register and used to control any one of the shift register above is provided, comprising:

- generating a driving signal set, which comprises a plurality of level signals comprising: a first driving signal, a second driving signal, a first voltage signal, and a second voltage signal;
- applying a plurality of the level signals to an output control module, a full screen reset module and a cascade output module respectively, so as to control the output control module to be turned off when there is electrostatic discharge in the shift register, control the full screen reset module to reset the potential of a second node and the potential of a first gate signal output terminal, the first gate signal output terminal having no signal output when the output control module is turned off and the second node and the first gate signal output terminal are in a reset state, as well as to make the cascade output module to provide the first voltage signal to the second gate signal output terminal under the control of the first driving signal, or to provide the second voltage signal to the second gate signal output terminal under the control of the second driving signal, wherein
  - the target signal is configured to drive a current row of display elements to display or not display, and a signal output by the second gate signal output terminal is configured to drive a next row of display elements to display or not display.

According to another aspect of the present application, a shift register driving apparatus is provided, comprising: a signal generator for generating a driving signal set, any one of the shift registers above, wherein a signal in the driving signal set generated by the signal generator is configured to be input into the shift register.

The above-mentioned shift register provided by an embodiment of the present invention comprises: an output control module, a full screen reset module, a cascade output module and an output module that are electrically connected; when there is no electrostatic discharge in the shift register, the output control module and the output module are both turned on so that the first gate signal output terminal outputs a target signal, and the output module provides a signal of the first clock signal terminal to the first gate signal output terminal under the control of a signal of the second node, or provides a signal of the first reference voltage terminal to the first gate signal output terminal under the control of a signal of the third node; when there is electrostatic discharge in the shift register, the output control module is turned off, the full screen reset module resets the potential of the second node and the potential of the first gate signal output terminal, the cascade output module provides the first voltage signal to the second gate signal output terminal under the control of the first driving signal, or provides the second voltage signal to the second gate signal output terminal, under the control of the second driving signal, a signal output by the second gate signal output terminal is configured to drive a next row of the display element to display or not display. By controlling a output signal of the current stage shift register and a input signal of the next stage shift register respectively via the output control module, the full screen reset module, the cascade output module and the output module, the output signal of the current stage shift register will not affect the input signal of the next stage shift register, thereby solving the problem in the prior art that when static electricity is released in a certain row of the display screen, the output signal of this row will affect the input signal of the next row, thereby improving the phenomenon of abnormal split screen on the display screen.

BRIEF DESCRIPTION OF THE DRAWINGS

The drawings constituting part of the present application are configured to provide a further understanding of the present application. The exemplary embodiments and descriptions of the present application are configured to explain the present application and do not constitute an improper limitation on the present application. In the drawings.

Figure 1:
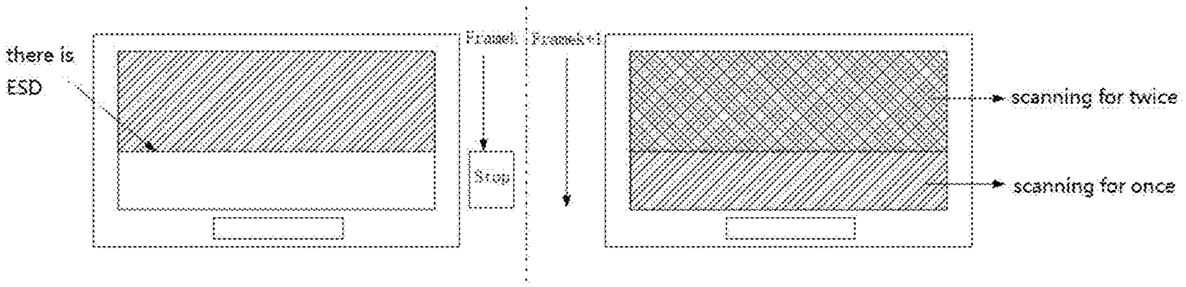
FIG. 1 is a schematic effect diagram showing a abnormal split screen on a display screen caused by electrostatic discharge based on an existing solution.

The above drawings include the following reference numerals:

01. output control module; 02. full screen reset module; 03. cascade output module; 04. output module; 05. node control module; 06. node charging module; 07. scanning control module; 08. reset module; 09. discharge module; 10. reset control module; 200. signal generator; 300. shift register.

DETAILED DESCRIPTION

In order to make the purpose, technical scheme and advantages of the present invention clearer, the present invention will be further described in detail below with reference to the accompanying drawings. Obviously, the described embodiments are only part of the embodiments of the present invention, rather than all the embodiments. Based on the embodiments of the present invention, all other embodiments obtained by the skilled in the art without creative work are within the scope of protection of the present invention.

The shapes and sizes of the components in the drawings do not reflect the actual proportions, purpose of which is only to illustrate the content of the invention.

In the existing gate driving circuit, except for the first stage of shift register SR(1), the input signal terminals Input_n of the remaining stages of shift registers SR(n) are respectively connected with the signal output terminals Output_n−1 of the previous stage of shift register SR(n−1). Each stage of shift register SR(n) comprises a pull-up node for controlling the signal output terminal to output a gate turn-on signal, and when the potential of the pull-up node is further pulled up, the signal output terminal outputs a gate turn-on signal.

At present, low voltage differential signaling (LVDS) is often used in touch display panels. It is a standard for high speed differential signal transmission, usually used in digital interfaces and communication systems. LVDS signals use low voltage and differential signal transmission to reduce electromagnetic interference and power consumption during signal transmission. This signal transmission way can provide high speed and reliable data transmission. However, LVDS is easily interfered by the ESD (electrostatic discharge) of the display panel, causing the screen to display abnormally (i.e., abnormal display).

In order to avoid the above situation, the technical means used in the prior art is to suspend the display of one frame when the IC (integrated circuit) detects that a row of LVDS on the display screen is abnormal. However, since the input signal terminal Input_n of each level of shift register SR(n) in the existing gate driving circuit is respectively connected with the signal output terminal Output_n−1 of the previous level shift register SR(n−1), that is, the output signal of each level of shift register is the input signal of the next level of shift register, and each level of shift register controls the display of each row in the display panel, as shown in FIG. 1, the current row of the display screen is electrostatically discharged in the kth frame, so the current row is controlled to suspend the display of one frame. When the output signal of the current row of the display panel stops outputting, the input signal of the next row will also be lost, resulting in uneven data received by the upper and lower screens, and it is impossible to restart from the current row in the next frame, and can only be re-written from the first row or the last row, which will cause the display row before the current row to be rewritten twice in the k+1th frame, while the display row after the current row is only rewritten once, which will cause abnormal screen splitting.

Figure 2:
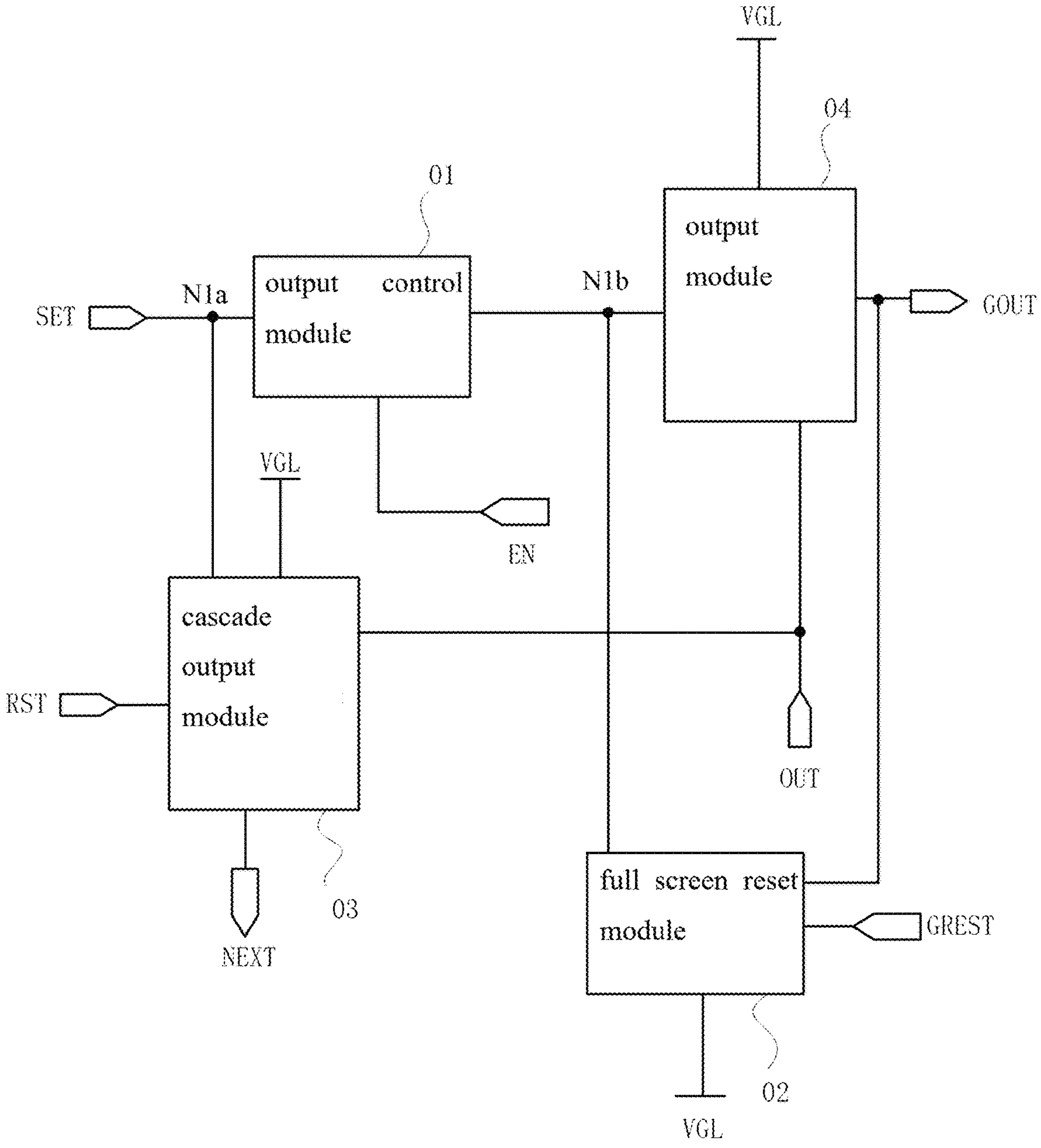
FIG. 2 is a schematic structural diagram of a shift register provided by an embodiment of the present invention.

A shift register provided by an embodiment of the present invention, as shown in FIG. 2, comprises: an output control module 01, a full screen reset module 02, a cascade output module 03 and an output module 04 that are electrically connected.

The output control module 01 is configured to turn on when there is no electrostatic discharge in the shift register to transmit a signal of a first node N1*a* to a second node N1*b* so that a first gate signal output terminal GOUT outputs a target signal, which is configured to drive the display element of the current row to display or not display, or to turn off when there is electrostatic discharge in the shift register.

The full screen reset module 02 is configured to reset the potential of the second node N1*b* and the potential of a first gate signal output terminal GOUT when there is electrostatic discharge in the shift register, when the output control module 01 is turned off and the second node N1*b* and the first gate signal output terminal GOUT are in a reset state, the first gate signal output terminal GOUT output no signal.

The cascade output module 03 is configured to provide a first voltage signal to the second gate signal output terminal NEXT under the control of the first driving signal when there is electrostatic discharge in the shift register, or to provide a second voltage signal to the second gate signal output terminal NEXT under the control of the second driving signal, a signal output by the second gate signal output terminal NEXT is configured to drive the display element of the next row to display or not display.

The output module 04 is configured to provide a signal of the first clock signal terminal OUT to the first gate signal output terminal GOUT under the control of a signal of the second node N1*b*, or to provide a signal of the first reference voltage terminal VGL to the first gate signal output terminal GOUT under the control of a signal of the third node, or to output no signal when the output control module 01 is turned off.

Figure 3:
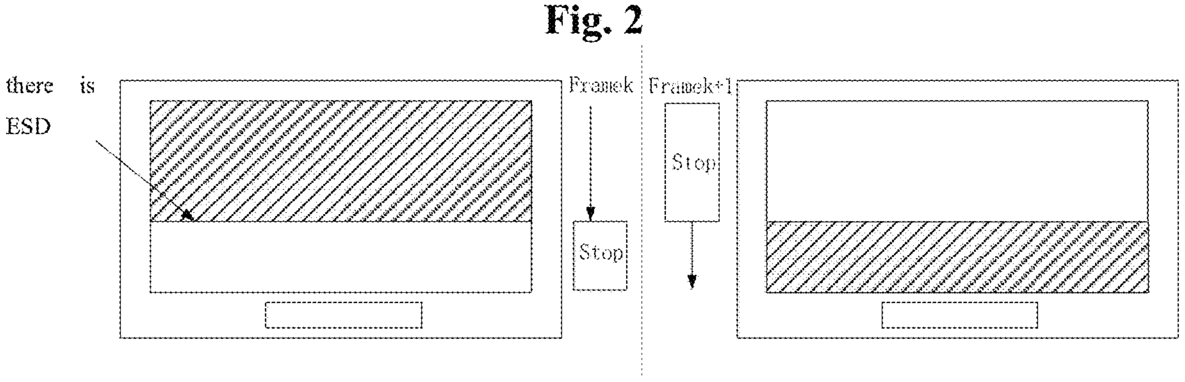
FIG. 3 is a schematic effect diagram showing a normal display on a display screen when electrostatic discharge occurs according to an embodiment of the present invention.

The above-mentioned shift register provided in this embodiment comprises: an output control module, a full screen reset module, a cascade output module and an output module that are electrically connected; when there is no electrostatic discharge in the shift register, the output control module and the output module are both turned on so that the first gate signal output terminal outputs the target signal, and the output module provides the signal of the first clock signal terminal to the first gate signal output terminal under the control of the signal of the second node, or provides the signal of the first reference voltage terminal to the first gate signal output terminal under the control of the signal of the third node; when there is electrostatic discharge in the shift register, the output control module is turned off, the full screen reset module resets the potential of the second node and the potential of the first gate signal output terminal, and the cascade output module provides the first voltage signal to the second gate signal output terminal under the control of the first driving signal, or provides the second voltage signal to the second gate signal output terminal under the control of the second driving signal, the signal output by the second gate signal output terminal is configured to drive the display element of the next row to display or not display. The output signal of the current shift register and the input signal of the next shift register are controlled by the output control module, the full screen reset module, the cascade output module and the output module respectively, so that the output signal of the current shift register will not affect the input signal of the next shift register, and the problem that when static electricity is released in a certain row of the display screen in the prior art, the output signal of this row will affect the input signal of the next row is solved, thereby improving the phenomenon of abnormal split screen on the display screen. The final effect is shown in FIG. 3. When static electricity is released in the current row of the kth frame, the display screen can be completely paused for one frame to the k+1th frame.

In this embodiment, the first driving signal is a signal of the first node or a signal of the first clock signal terminal OUT. When the first driving signal is a signal of the first node, the first voltage signal is a signal of the first clock signal terminal OUT. When the first driving signal is a signal of the first clock signal terminal OUT, the first voltage signal is a signal of the first node. The second driving signal is a signal of the reset control terminal RST or a signal of the third node N2 of FIG. 4, the second voltage signal is a signal of the first reference voltage terminal VGL. The target signal is a signal of the first reference voltage terminal VGL or a signal of the first clock signal terminal OUT.

Specifically, when there is no electrostatic discharge in the shift register, the output control module is turned on, the first gate signal output terminal GOUT is controlled via the output module to output the signal of the first reference voltage terminal VGL or the signal of the first clock signal terminal OUT, so as to provide a gate turn-on signal to the gate line connected with the first gate signal output terminal GOUT to turn on the TFT of the pixel area of the current row. When there is electrostatic discharge in the shift register, the output control module is turned off, the second gate signal output terminal NEXT is controlled via the cascade output module to output the signal of the first reference voltage terminal VGL or the signal of the first clock signal terminal OUT, so as to provide an input signal to the next stage of shift register. In the prior art, the output signal of the current row (i.e., the GOUT signal) is the input signal of the next row (i.e., the NEXT signal), that is, the output signal of the current row (i.e., the GOUT signal) will affect the input signal of the next row (i.e., the NEXT signal). The NEXT signal in this solution and the GOUT signal of the previous stage are no longer associated as in the prior art. Instead, the output signal of the current stage of shift register and the input signal of the next stage of shift register are controlled respectively via the output control module, the full screen reset module, the cascade output module and the output module, so that the output signal of the current stage of shift register will not affect the input signal of the next stage of shift register. This can solve the problem in the prior art that when static electricity is released in a certain row of the display screen, the output signal of this row will affect the input signal of the next row, thereby improving the phenomenon of abnormal split screen on the display screen.

Figure 4:
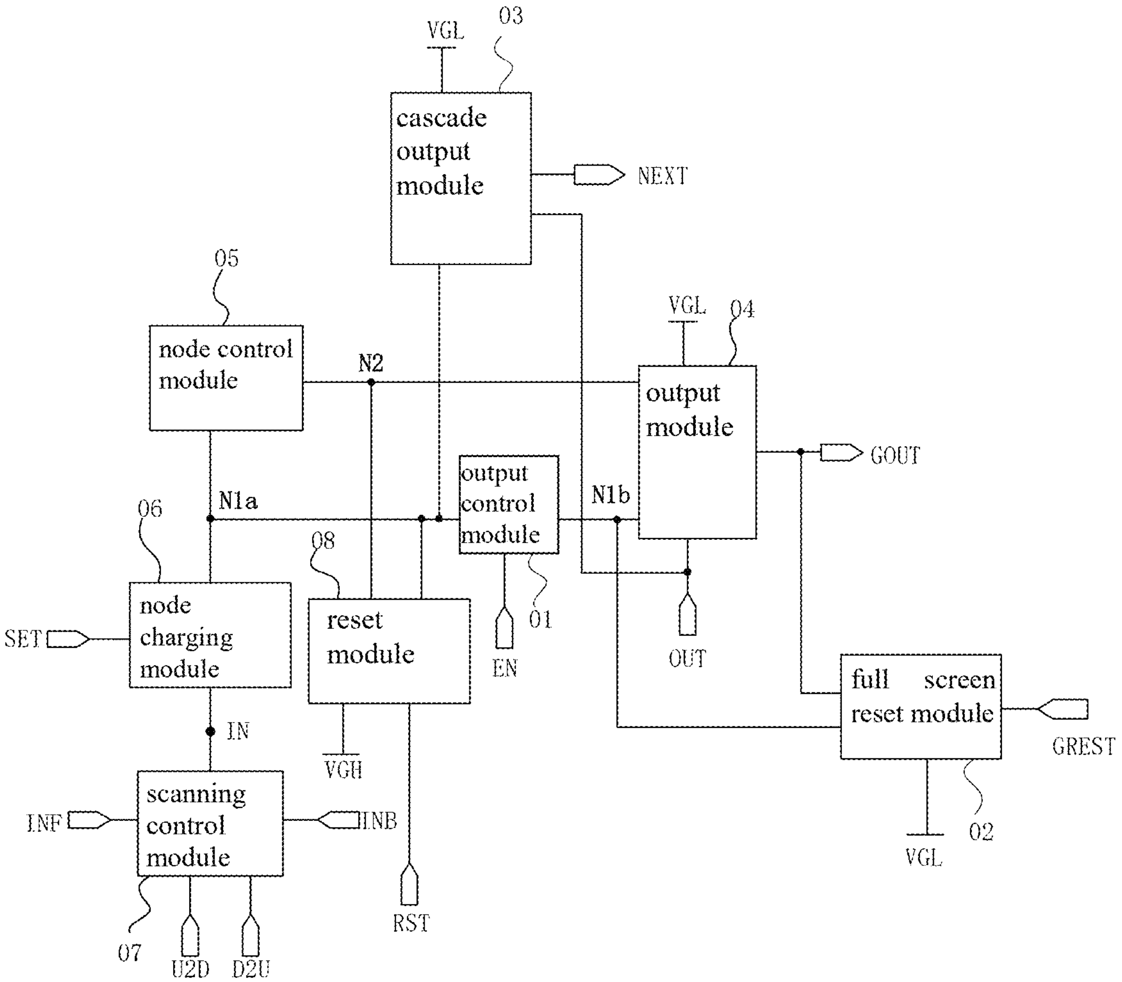
FIG. 4 is a schematic structural diagram of a shift register provided by another embodiment of the present invention.

Optionally, in the shift register provided in an embodiment of the present invention, as shown in FIG. 4, it further comprises: a node control module 05, a node charging module 06, a scanning control module 07 and a reset module 08 that are electrically connected.

The node control module 05 is configured to control a signal of the second node N1*b* and a signal of the third node N2 to have opposite levels according to the signal of the second node N1*b* or the signal of the third node N2.

The node charging module 06 comprises a first control terminal SET and is configured to provide a signal of the input node IN to the third node N2 under the control of a signal of the first control terminal SET.

The scanning control module 07 is configured to provide a signal of the forward scanning control signal terminal U2D to the input node IN under the control of a signal of the forward scanning input signal terminal INF, or to provide a signal of the reverse scanning control signal terminal D2U to the input node IN under the control of a signal of the reverse scanning input signal terminal INB.

The reset module 08 comprises a reset control terminal RST configured to reset the potential of the first node N1*a* under the control of the reset control terminal RST and provide a signal of the second reference voltage terminal VGH to the third node N2.

In the shift register provided in this embodiment, the scanning control module is configured to provide the signal of the forward scanning control signal terminal U2D to the input node IN under the control of the signal of the forward scanning input signal terminal INF, or to provide the signal of the reverse scanning control signal terminal D2U to the input node IN under the control of the signal of the reverse scanning input signal terminal INB. In this way, during the non-scanning period, the scanning control module makes the input node IN in a floating state under the control of the forward scanning input signal terminal INF or the reverse scanning input signal terminal INB, and then makes the first node N1*a* in a floating state via the node charging module, so that the potential of the first node N1*a* will not leak via the input node IN, and the potential of the first node N1*a* is maintained. When the shift register is restored from the non-scanning period to the scanning period and works normally to output the scanning signal to the gate line, the output module can provide the signal of the first clock signal terminal OUT to the first gate signal output terminal GOUT under the control of the signal of the first node N1*a*, so that the shift register can normally output the scanning signal to the gate line, thereby improving the problem of abnormal output signal when the shift register enters the scanning period again and improving the dark line phenomenon.

In this embodiment, the non-scanning period of the shift register is a period during which the shift register stops outputting the scanning signal to the gate line.

Specifically, in the display apparatus, during forward scanning, the forward scanning input signal terminal INF of the first stage of shift register is generally configured to receive a start signal, and the forward scanning input signal terminals INF of the shift registers other than the first stage of shift register are configured to receive a signal output by the second gate signal output terminal NEXT of the previous stage of shift register. During reverse scanning, the reverse scanning input signal terminal INB of the last stage of shift register is generally configured to receive a start signal, the reverse scanning input signal terminals INB of the shift registers other than the last stage of shift register are configured to receive a signal output by the second gate signal output terminal NEXT of the next stage of shift register.

Figure 5:
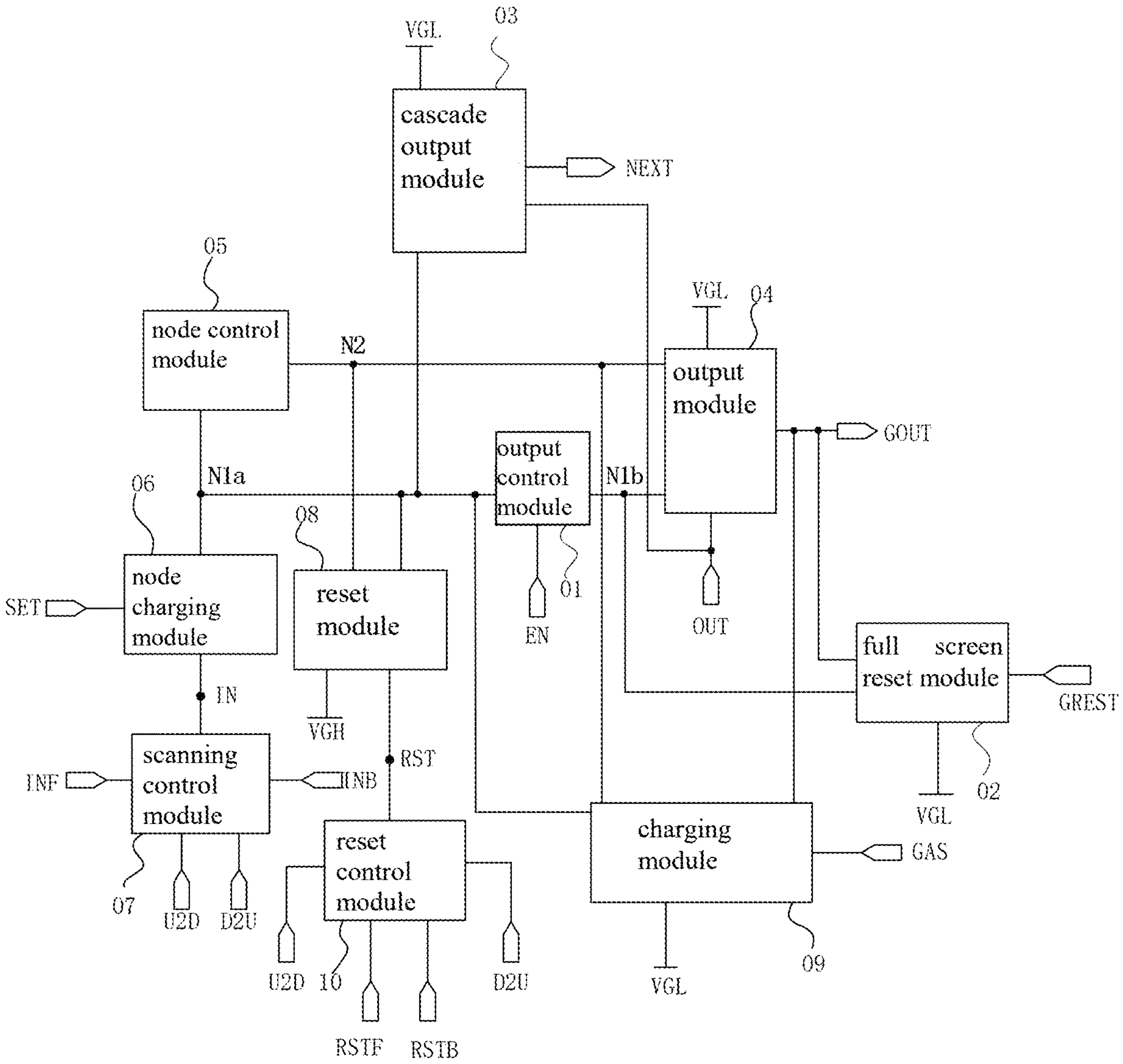
FIG. 5 is a schematic structural diagram of a shift register provided by another embodiment of the present invention.

Optionally, in the shift register provided in the embodiment of the present invention, as shown in FIG. 5, it further comprises a discharge module 09 and a reset control module 10 that are electrically connected.

The discharge module 09 comprises a discharge control terminal GAS and is configured to provide a signal of the first reference voltage terminal VGL to the first node N1*a* and the third node N2 respectively, and provide a signal of the discharge control terminal GAS to the first gate signal output terminal GOUT under the control of the discharge control terminal GAS.

The reset control module 10 is configured to provide a signal of the second clock signal terminal RSTF to the reset control terminal RST under the control of a signal of the forward scanning control signal terminal U2D, or to provide a signal of the third clock signal terminal RSTB to the reset control terminal RST under the control of a signal of the reverse scanning control signal terminal D2U.

In a specific implementation, under the control of the discharge control terminal GAS, the discharge module provides a signal of the first reference voltage terminal VGL to the first node N1*a* and the third node N2 respectively, so that the first node N1*a* and the third node N2 of the shift register are discharged, and the internal discharge of the shift register is realized. Under the control of the discharge control terminal GAS, the discharge module provides a signal of the discharge control terminal GAS to the first gate signal output terminal GOUT. Since the transistors in the discharge control module are all NMOS, when the discharge control terminal GAS is at a high level, the discharge module is turned on and provides the high level of the discharge control terminal GAS to the first gate signal output terminal GOUT, while the first gate signal output terminal GOUT is generally connected with a row of pixels, so that the discharge of the corresponding row of pixels can be realized.

The reset control module can further ensure that the shift register can be reset in time after the first gate signal output terminal GOUT outputs the gate signal.

The present invention is described in detail below in conjunction with specific embodiments. It should be noted that the embodiments are for better explanation of the present invention, but not for limiting the present invention.

It should be noted that in a specific implementation, the first electrode of the transistor can be used as its source and the second electrode as its drain, depending on the type of transistor and the signal of its gate; or, conversely, the first electrode of the transistor can be used as its drain and the second electrode can be used as its source, without making a specific distinction here.

It should be noted that transistors are generally divided into N-type transistors and P-type transistors, wherein the N-type transistor is turned on by a high-level signal and turned off by a low level signal, and the P-type transistor is turned on by a low level signal and turned off by a high-level signal.

Figure 6:
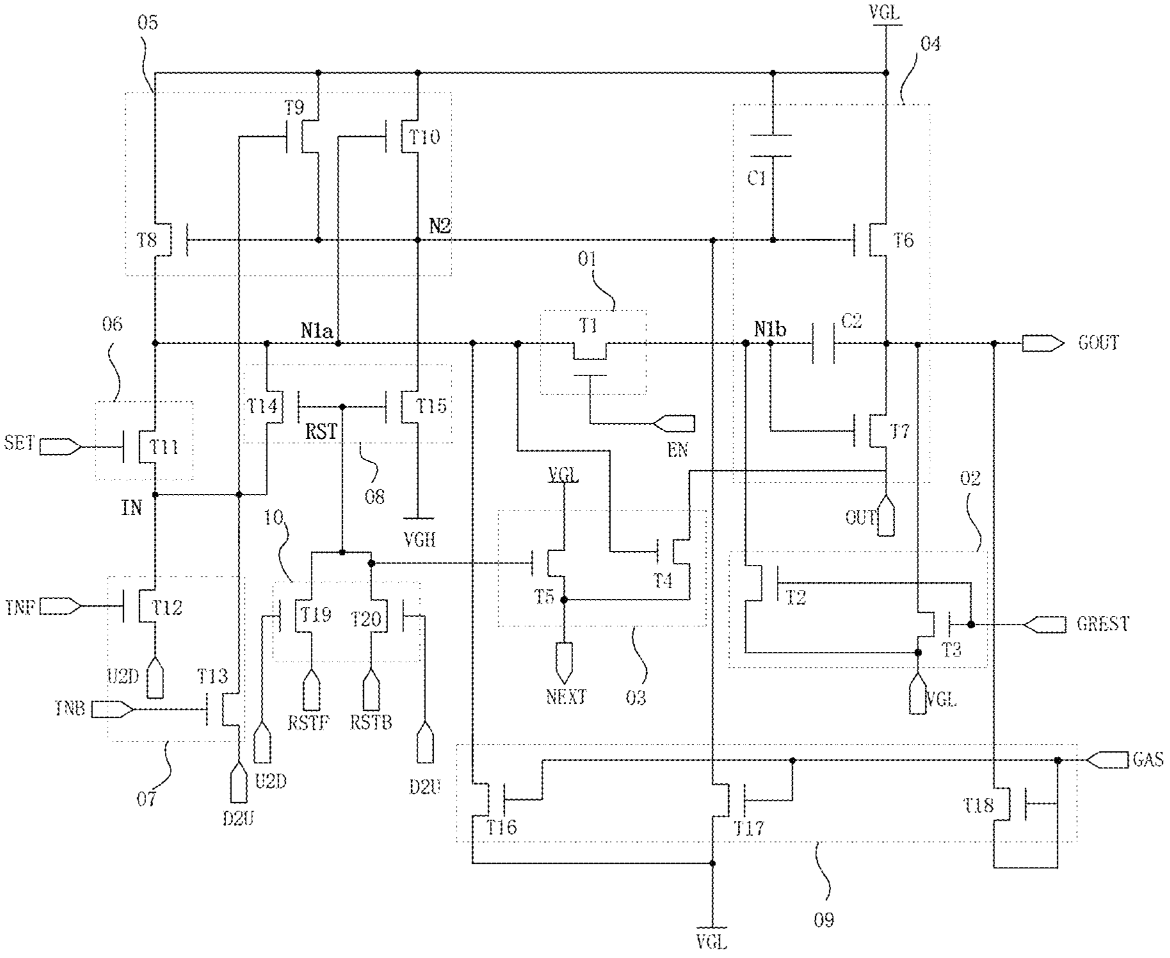
FIG. 6 is a schematic structural diagram of a shift register provided by another embodiment of the present invention.
Figure 7:
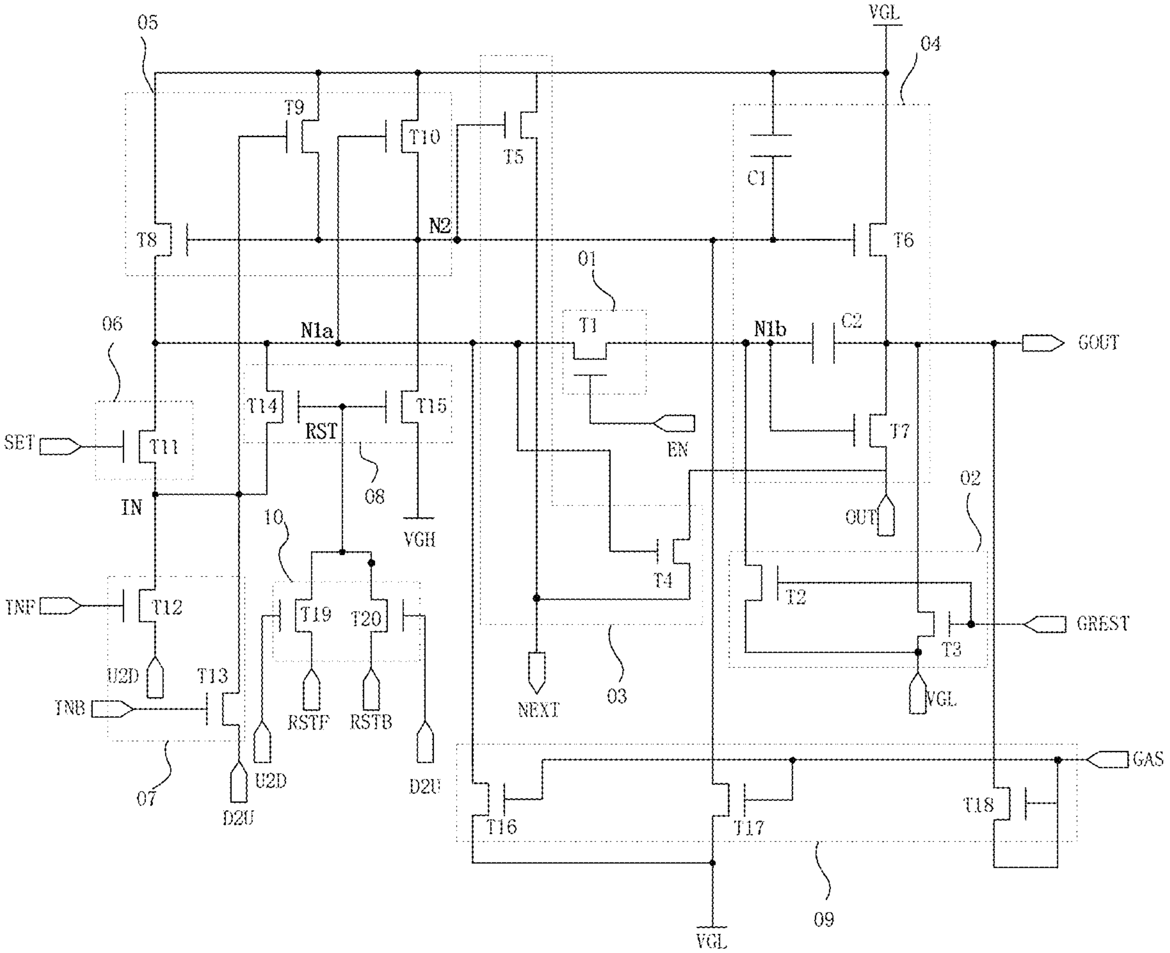
FIG. 7 is a schematic structural diagram of a shift register provided by another embodiment of the present invention.
Figure 8:
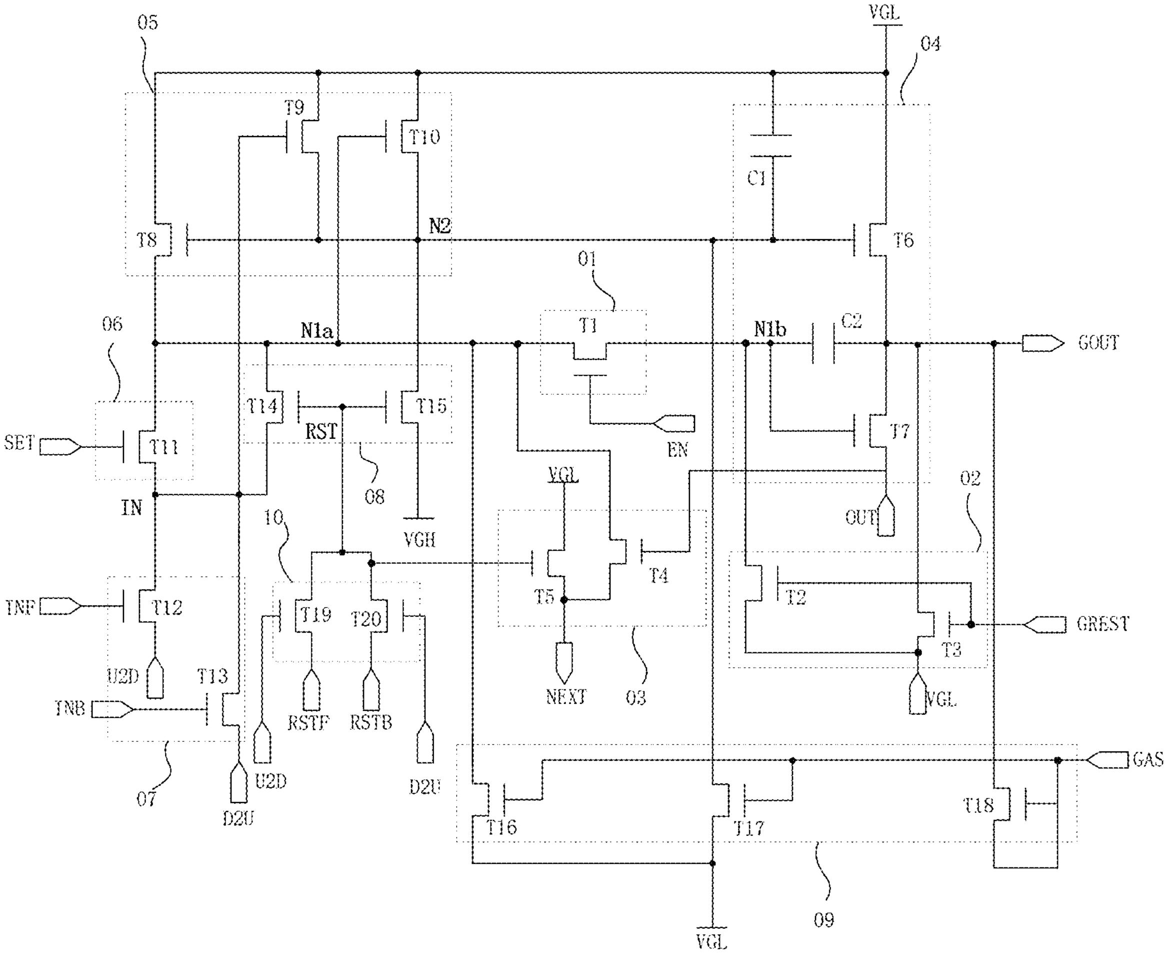
FIG. 8 is a schematic structural diagram of a shift register provided by another embodiment of the present invention.

Optionally, in the shift register provided in the embodiment of the present invention, as shown in FIGS. 6 to 8, the output control module 01 comprises a first transistor T1, the full screen reset module 02 comprises a second transistor T2 and a third transistor T3.

A gate of the first transistor T1 is configured to input the third driving signal EN, a first electrode of the first transistor T1 is connected with the first node N1*a*, a second electrode of the first transistor T1 is connected with the second node N1*b*, the third driving signal EN is configured to control the first transistor T1 to be turned on.

A gate of the second transistor T2 is configured to input the fourth driving signal GREST, a first electrode of the second transistor T2 is connected with the second node N1*b*, and a second electrode of the second transistor T2 is connected with the first reference voltage terminal VGL.

A gate of the third transistor T3 is configured to input the fourth driving signal GREST, a first electrode of the third transistor T3 is electrically connected with the first gate signal output terminal GOUT, and a second electrode of the third transistor T3 is connected with the first reference voltage terminal VGL.

In this embodiment, when there is no electrostatic discharge in the shift register, the third driving signal EN controls the first transistor T1 to be turned on, so that the first node N1*a* and the second node N1*b* are turned on; the fourth driving signal GREST controls the second transistor T2 and the third transistor T3 to be turned off, so that the first gate signal output terminal GOUT outputs the signal of the first reference voltage terminal VGL or outputs the signal of the first clock signal terminal OUT. When there is electrostatic discharge in the shift register, the third driving signal EN controls the first transistor T1 to be turned off, and the fourth driving signal GREST controls the second transistor T2 and the third transistor T3 to be turned on, so that the signal of the first reference voltage terminal VGL is transmitted to the second node Nb and the first gate signal output terminal GOUT, so as to reset the potential of the second node N1*b* and the first gate signal output terminal GOUT.

The transistors in the cascade output module can be connected in a variety of ways, as long as ensuring that when there is electrostatic discharge in the shift register, the second gate signal output terminal NEXT is controlled to output the signal of the first reference voltage terminal VGL or the signal of the first clock signal terminal OUT. The following embodiments provide three connecting structures of the transistors in the cascade output module, and the specific structures are shown in FIGS. 6 to 8.

Optionally, in the shift register provided in the embodiment of the present invention, as shown in FIG. 6, the cascade output module 03 comprises a fourth transistor T4 and a fifth transistor T5.

A gate of the fourth transistor T4 is connected with the first node N1*a*, a first electrode of the fourth transistor T4 is connected with the second gate signal output terminal NEXT, and a second electrode of the fourth transistor T4 is connected with the first clock signal terminal OUT.

A gate of the fifth transistor T5 is connected with the reset control terminal RST, a first electrode of the fifth transistor T5 is connected with the first reference voltage terminal VGL, and a second electrode of the fifth transistor T5 is connected with the second gate signal output terminal NEXT.

In this embodiment, the first node N1*a* is configured to control the fourth transistor T4 to be turned on or off, and the reset control terminal RST is configured to control the fifth transistor T5 to be turned on or off. When the fourth transistor T4 is turned on, the signal of the first clock signal terminal OUT can be transmitted to the second gate signal output terminal NEXT, and when the fifth transistor T5 is turned on, the signal of the first reference voltage terminal VGL can be transmitted to the second gate signal output terminal NEXT.

Optionally, in the shift register provided in the embodiment of the present invention, as shown in FIG. 7, the cascade output module 03 comprises a fourth transistor T4 and a fifth transistor T5.

A gate of the fourth transistor T4 is connected with the first node N1*a*, a first electrode of the fourth transistor T4 is connected with the second gate signal output terminal NEXT, and a second electrode of the fourth transistor T4 is connected with the first clock signal terminal OUT.

A gate of the fifth transistor T5 is connected with the third node N2, a first electrode of the fifth transistor T5 is connected with the first reference voltage terminal VGL, and a second electrode of the fifth transistor T5 is connected with the second gate signal output terminal NEXT.

In this embodiment, the first node N1*a* is configured to control the fourth transistor T4 to be turned on or off, and the third node N2 is configured to control the fifth transistor T5 to be turned on or off. When the fourth transistor T4 is turned on, the signal of the first clock signal terminal OUT can be transmitted to the second gate signal output terminal NEXT, and when the fifth transistor T5 is turned on, the signal of the first reference voltage terminal VGL can be transmitted to the second gate signal output terminal NEXT.

Optionally, in the shift register provided in the embodiment of the present invention, as shown in FIG. 8, the cascade output module 03 comprises a fourth transistor T4 and a fifth transistor T5.

A gate of the fourth transistor T4 is connected with the first clock signal terminal OUT, a first electrode of the fourth transistor T4 is connected with the first node N1*a*, and a second electrode of the fourth transistor T4 is connected with the second gate signal output terminal NEXT.

A gate of the fifth transistor T5 is connected with the reset control terminal RST, a first electrode of the fifth transistor T5 is connected with the first reference voltage terminal VGL, and a second electrode of the fifth transistor T5 is connected with the second gate signal output terminal NEXT.

In this embodiment, the first clock signal terminal OUT is configured to control the fourth transistor T4 to be turned on or off, and the reset control terminal RST is configured to control the fifth transistor T5 to be turned on or off. When the fourth transistor T4 is turned on, the signal of the first node N1*a* can be transmitted to the second gate signal output terminal NEXT, and when the fifth transistor T5 is turned on, the signal of the first reference voltage terminal VGL can be transmitted to the second gate signal output terminal NEXT.

Optionally, in the shift register provided in the embodiment of the present invention, as shown in FIGS. 6 to 8, the output module 04 comprises a sixth transistor T6, a seventh transistor T7, a first capacitor C1 and a second capacitor C2.

A gate of the sixth transistor T6 is connected with the third node N2, a first electrode of the sixth transistor T6 is connected with the first reference voltage terminal VGL, and a second electrode of the sixth transistor T6 is connected with the first gate signal output terminal GOUT.

A gate of the seventh transistor T7 is connected with the second node N1*b*, a first electrode of the seventh transistor T7 is connected with the second electrode of the sixth transistor T6 and the first gate signal output terminal GOUT respectively, and a second electrode of the seventh transistor T7 is connected with the first clock signal terminal OUT.

A first electrode of the first capacitor C1 is connected with the first reference voltage terminal VGL, and a second electrode of the first capacitor C1 is connected with the third node N2 and the gate of the sixth transistor T6 respectively.

A first electrode of the second capacitor C2 is connected with the second node N1*b* and the gate of the seventh transistor T7 respectively, and a second electrode of the second capacitor C2 is connected with the first gate signal output terminal GOUT.

In this embodiment, the third node N2 is configured to control the sixth transistor T6 to be turned on or off, when the sixth transistor T6 is turned on, the signal of the first reference voltage terminal VGL can be transmitted to the first gate signal output terminal GOUT; the second node N1*b* is configured to control the seventh transistor T7 to be turned on or off, when the seventh transistor T7 is turned on, the signal of the first clock signal terminal OUT can be transmitted to the first gate signal output terminal GOUT; the first capacitor C1 and the second capacitor C2 have a coupling effect and can be configured to stabilize the potential of the second node N1*b* and the third node N2. In this embodiment, since the node control module can control the potential of the second node N1*b* and the third node N2 to be opposite, one of the seventh transistor T7 controlled by the second node N1*b* and the sixth transistor T6 controlled by the third node N2 is turned on and the other one is turned off. Correspondingly, the first gate signal output terminal GOUT outputs the signal of the first reference voltage terminal VGL or the signal of the first clock signal terminal OUT, thereby ensuring that the first gate signal output terminal GOUT does not output the signal of the first reference voltage terminal VGL and the signal of the first clock signal terminal OUT at the same time.

Optionally, in the shift register provided in the embodiment of the present invention, as shown in FIGS. 6 to 8, the node control module 05 comprises an eighth transistor T8, a ninth transistor T9 and a tenth transistor T10.

A gate of the eighth transistor T8 is connected with the third node N2, a first electrode of the eighth transistor T8 is connected with the node charging module 06 and the first node N1*a* respectively, and a second electrode of the eighth transistor T8 is connected with the first reference voltage terminal VGL.

A gate of the ninth transistor T9 is connected with the input node IN, a first electrode of the ninth transistor T9 is connected with the first reference voltage terminal VGL, and a second electrode of the ninth transistor T9 is connected with the gate of the eighth transistor T8 and the third node N2 respectively.

A gate of the tenth transistor T10 is connected with the first node N1*a*, a first electrode of the tenth transistor T10 is connected with the first reference voltage terminal VGL, and a second electrode of the tenth transistor T10 is connected with the third node N2.

In this embodiment, the third node N2 is configured to control the eighth transistor T8 to be turned on or off, when the eighth transistor T8 is turned on, the signal of the first reference voltage terminal VGL can be transmitted to the first node N1*a*; the input node IN is configured to control the ninth transistor T9 to be turned on or off, when the ninth transistor T9 is turned on, the signal of the first reference voltage terminal VGL can be transmitted to the third node N2; the first node N1*a* is configured to control the tenth transistor T10 to be turned on or off, when the tenth transistor T10 is turned on, the signal of the first reference voltage terminal VGL can be transmitted to the third node N2.

Optionally, in the shift register provided in the embodiment of the present invention, as shown in FIGS. 6 to 8, the node charging module 06 comprises an eleventh transistor T11.

A gate of the eleventh transistor T11 is connected with the first control terminal SET, a first electrode of the eleventh transistor T11 is connected with the first node N1*a*, and a second electrode of the eleventh transistor T11 is connected with the input node IN.

In an embodiment, the first control terminal SET is configured to control the eleventh transistor T11 to be turned on or off. When the eleventh transistor T11 is turned on, the signal of the input node IN can be transmitted to the first node N1*a*.

Optionally, in the shift register provided in the embodiment of the present invention, as shown in FIGS. 6 to 8, the scanning control module 07 comprises a twelfth transistor T12 and a thirteenth transistor T13.

A gate of the twelfth transistor T12 is connected with the forward scanning input signal terminal INF, a first electrode of the twelfth transistor T12 is connected with the forward scanning control signal terminal U2D, and a second electrode of the twelfth transistor T12 is connected with the input node IN.

A gate of the thirteenth transistor T13 is connected with the reverse scanning input signal terminal INB, a first electrode of the thirteenth transistor T13 is connected with the reverse scanning control signal terminal D2U, and a second electrode of the thirteenth transistor T13 is connected with the input node IN.

In this embodiment, the forward scanning input signal terminal INF is configured to control the twelfth transistor T12 to be turned on or off, when the twelfth transistor T12 is turned on, the signal of the forward scanning control signal terminal U2D can be transmitted to the input node IN; the reverse scanning input signal terminal INB is configured to control the thirteenth transistor T13 to be turned on or off, when the thirteenth transistor T13 is turned on, the signal of the reverse scanning control signal terminal D2U can be transmitted to the input node IN. The twelfth transistor T12 or the thirteenth transistor T13 is turned on only when there is an input signal, that is, the input node IN is only turned on when the forward scanning input signal terminal INF or the reverse scanning input signal terminal INB has an input signal, and is in a floating state at other times, which is equivalent to blocking the leakage of the first node N1*a* in the direction of the input node IN, so that the potential of the first node N1*a* can be maintained.

Optionally, in the shift register provided in the embodiment of the present invention, as shown in FIGS. 6 to 8, the reset module 08 comprises a fourteenth transistor T14 and a fifteenth transistor T15.

A gate of the fourteenth transistor T14 is connected with the reset control terminal RST, a first electrode of the fourteenth transistor T14 is connected with the first node N1*a*, and a second electrode of the fourteenth transistor T14 is connected with the input node IN.

A gate of the fifteenth transistor T15 is connected with the gate of the fourteenth transistor T14 and the reset control terminal RST respectively, a first electrode of the fifteenth transistor T15 is connected with the third node N2, and a second electrode of the fifteenth transistor T15 is connected with the second reference voltage terminal VGH.

In this embodiment, the reset control terminal RST is configured to control the fourteenth transistor T14 to be turned on or off, when the fourteenth transistor T14 is turned on, the potential of the input node IN can be transmitted to the first node N1*a*; the reset control terminal RST is configured to control the fifteenth transistor T15 to be turned on or off, when the fifteenth transistor T15 is turned on, the signal of the second reference voltage terminal VGH can be transmitted to the third node N2.

Optionally, in the shift register provided in the embodiment of the present invention, the channel width-to-length ratio of the fifteenth transistor T15 is respectively greater than the channel width-to-length ratio of the ninth transistor T9 and the channel width-to-length ratio of the tenth transistor T10. It is ensured that in the reset phase, the potential of the third node N2 is controlled by the fifteenth transistor T15, thereby ensuring that the potential of the third node N2 is the potential of the second reference voltage terminal VGH.

Optionally, in the shift register provided in the embodiment of the present invention, as shown in FIGS. 6 to 8, the discharge module 09 comprises a sixteenth transistor T16, a seventeenth transistor T17 and an eighteenth transistor T18.

A gate of the sixteenth transistor T16 is connected with the discharge control terminal GAS, a first electrode of the sixteenth transistor T16 is connected with the first node N1*a*, and a second electrode of the sixteenth transistor T16 is connected with the first reference voltage terminal VGL.

A gate of the seventeenth transistor T17 is connected with the discharge control terminal GAS, a first electrode of the seventeenth transistor T17 is connected with the third node N2, and a second electrode of the seventeenth transistor T17 is connected with the first reference voltage terminal VGL.

A gate of the eighteenth transistor T18 is connected with the discharge control terminal GAS, a first electrode of the eighteenth transistor T18 is connected with the first gate signal output terminal GOUT, and a second terminal of the eighteenth transistor T18 is connected with the discharge control terminal GAS.

In this embodiment, the discharge control terminal GAS is configured to simultaneously control the sixteenth transistor T16, the seventeenth transistor T17 and the eighteenth transistor T18 to be turned on or off. When the sixteenth transistor T16 is turned on, the signal of the first reference voltage terminal VGL can be transmitted to the first node N1*a*. When the seventeenth transistor T17 is turned on, the signal of the first reference voltage terminal VGL can be transmitted to the third node N2. When the eighteenth transistor T18 is turned on, the signal of the discharge control terminal GAS can be transmitted to the first gate signal output terminal GOUT.

Optionally, in the shift register provided in the embodiment of the present invention, as shown in FIGS. 6 to 8, the reset control module 10 comprises a nineteenth transistor T19 and a twentieth transistor T20.

A gate of the nineteenth transistor T19 is connected with the forward scanning control signal terminal U2D, a first electrode of the nineteenth transistor T19 is connected with the reset control terminal RST, and a second electrode of the nineteenth transistor T19 is connected with the second clock signal terminal RSTF.

A gate of the twentieth transistor T20 is connected with the reverse scanning control signal terminal D2U, a first electrode of the twentieth transistor T20 is connected with the reset control terminal RST, and a second electrode of the twentieth transistor T20 is connected with the third clock signal terminal RSTB.

In this embodiment, the forward scanning control signal terminal U2D is configured to control the nineteenth transistor T19 to be turned on or off, when the nineteenth transistor T19 is turned on, the signal of the second clock signal terminal RSTF can be transmitted to the reset control terminal RST; the reverse scanning control signal terminal D2U is configured to control the twentieth transistor T20 to be turned on or off, when the twentieth transistor T20 is turned on, the signal of the third clock signal terminal RSTB can be transmitted to the reset control terminal RST.

The above are only examples to illustrate some specific structures of modules in the shift register. In specific implementations, the specific structure of each module is not limited to the above structure provided in the embodiment of the present invention, and can also be other structures known to those skilled in the art, which is not limited here.

It should be noted that, in the shift register provided in an embodiment of the present invention, when all transistors are N-type transistors, the signal of the first reference voltage terminal VGL is a low level signal, and the signal of the second reference voltage terminal VGH is a high-level signal; when all transistors are P-type transistors, the signal of the first reference voltage terminal VGL is a high-level signal, and the signal of the second reference voltage terminal VGH is a low level signal.

In the shift register provided by the embodiment of the present invention, the signals of the first clock signal terminal OUT, the second clock signal terminal RSTF and the third clock signal terminal RSTB are all pulse signals, and the signal of the first control terminal SET may also be a pulse signal.

Figure 9:
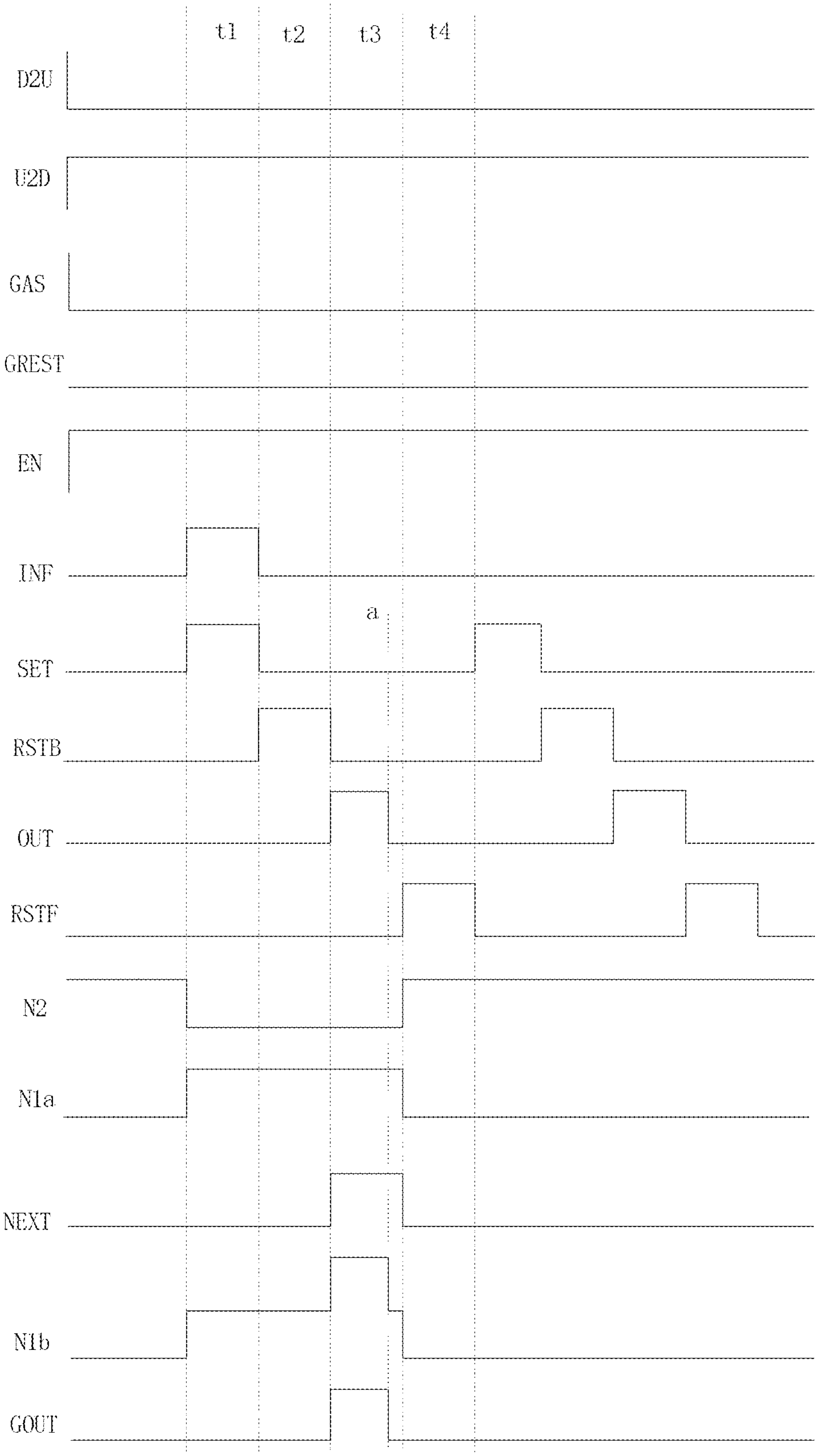
FIG. 9 is a circuit timing diagram of the kth frame corresponding to the shift register shown in FIG. 6.
Figure 10:
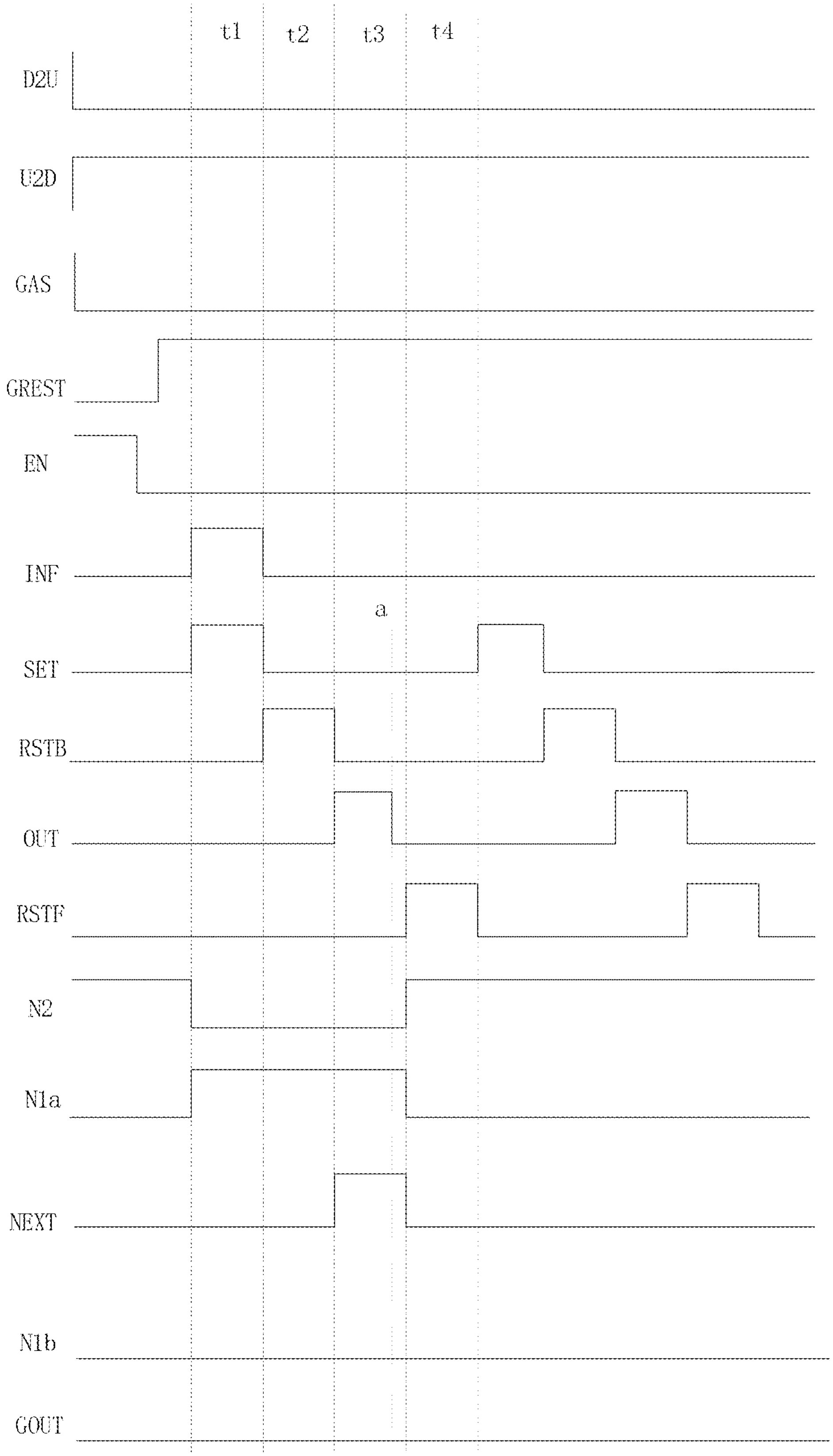
FIG. 10 is a circuit timing diagram of the k+1th frame corresponding to the shift register shown in FIG. 6.
Figure 11:
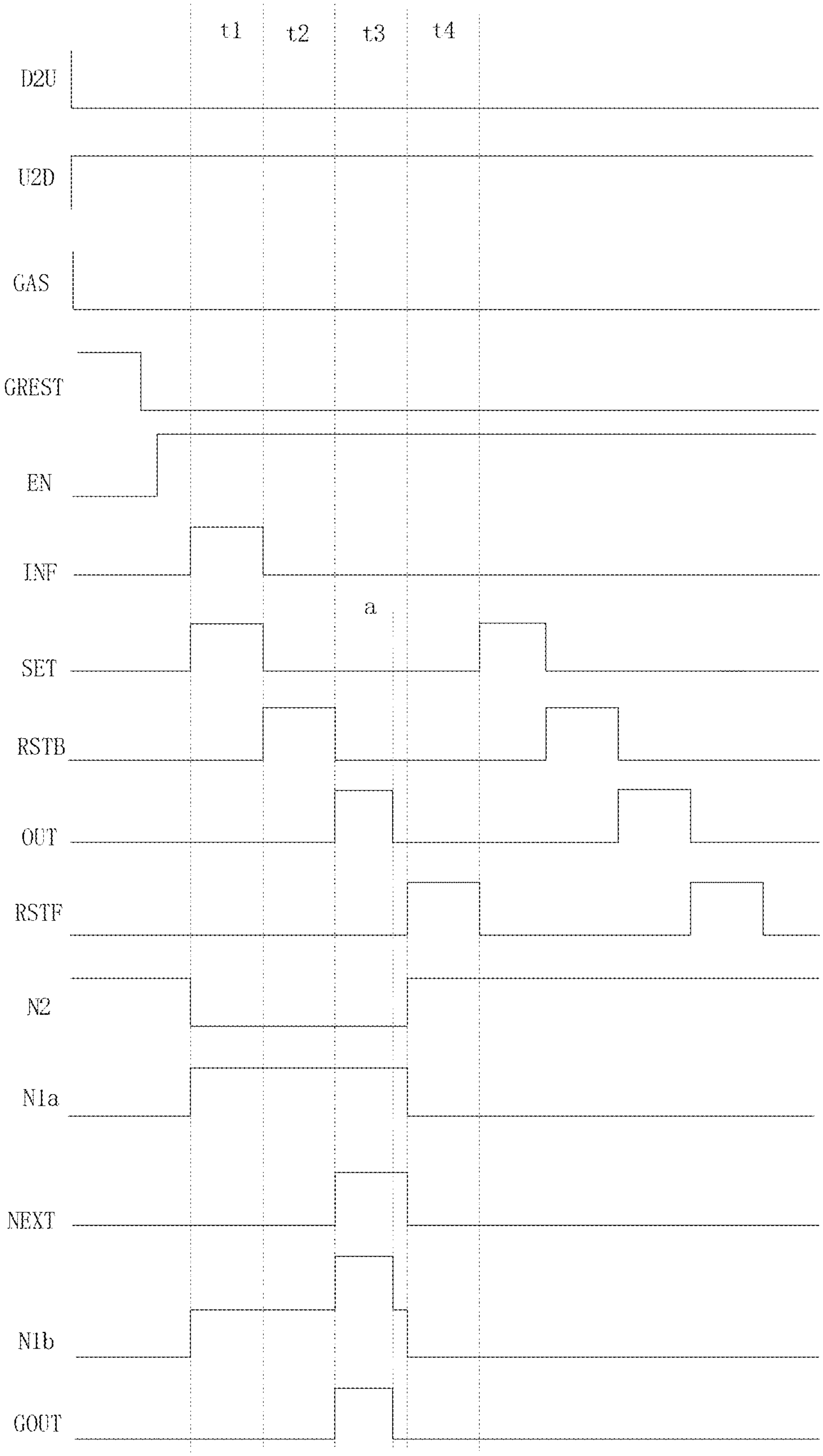
FIG. 11 is a circuit timing diagram of the k+2th frame corresponding to the shift register shown in FIG. 6.

In combination with the circuit timing diagrams shown in FIGS. 9 to 11, the shift register shown in FIG. 6 is taken as an example to describe the working process of the shift register provided by the embodiment of the present invention when performing forward scanning. In the following description, 1 represents a high level and 0 represents a low level. It should be noted that 1 and 0 are logic potentials, which are only for better explanation of the specific working process of the embodiment of the present invention, rather than specific voltage values.

Specifically, an example is taken as the forward scanning of the kth frame, as shown in FIG. 9.

During forward scanning, D2U-0, the twentieth transistor T20 is turned off; GAS=0, the sixteenth transistor T16, the seventeenth transistor T17, and the eighteenth transistor T18 are all turned off; U2D=1, the nineteenth transistor T19 is turned on.

In the t1 stage (i.e. the input stage), INF=1, SET=1, OUT=0, RSTF=0, RSTB=0, EN=1, and GREST=0.

The signal of the reverse scanning input signal terminal INB controls the thirteenth transistor T13 to be turned off, controls the eleventh transistor T11, the twelfth transistor T12 and the first transistor T1 to be turned on, and the high level signal of the forward scanning control signal terminal U2D is transmitted to the input node IN via the twelfth transistor T12, thus the potential of the input node IN is high. The high potential of the input node IN is transmitted to the first node N1*a* via the eleventh transistor T11, and then transmitted to the second node N1*b* via the first transistor T1; therefore, under the control of the first node N1*a*, the tenth transistor T10 is turned on, and under the control of the second node N1*b*, the seventh transistor T7 is turned on, the low level signal of the first reference voltage terminal VGL is transmitted to the third node N2 via the tenth transistor T10, and the potential of the third node N2 is low. The low level signal of the first clock signal terminal OUT is transmitted to the first gate signal output terminal GOUT via the seventh transistor T7, thus the potential of the first gate signal output terminal GOUT is low. The input node IN controls the ninth transistor T9 to be turned on, and the low level signal of the first reference voltage terminal VGL is transmitted to the third node N2 via the ninth transistor T9, further ensuring that the potential of the third node N2 is low. Under the control of the third node N2, the eighth transistor T8 and the sixth transistor T6 are turned off. The low level signal of the second clock signal terminal RSTF is transmitted to the reset control terminal RST via the nineteenth transistor T19, and the potential of the reset control terminal RST is low. The reset control terminal RST controls the fourteenth transistor T14, the fifteenth transistor T15 and the fifth transistor T5 to be turned off, the first node N1*a* controls the fourth transistor to be turned on, and the low level signal of the first clock signal terminal OUT is transmitted to the second gate signal output terminal NEXT via the fourth transistor, thus the potential of the second gate signal output terminal NEXT is low. At this stage, the first node N1*a* and the second node N1*b* have high potentials, while the third node N2 has low potential.

In stage t2, INF=0, SET=0, OUT=0, RSTF=0, RSTB=1, EN=1, GREST=0.

The signal of the reverse scanning input signal terminal INB controls the thirteenth transistor T13 to be turned off. The twelfth transistor T12 and the eleventh transistor T11 are turned off, the first node N1*a* is in a floating state, the potential of the first node N1*a* still remains a high potential, and the potential of the second node N1*b* is still a high potential by means of the first transistor T1. The first node N1*a* controls the tenth transistor T10 to be turned on, the low level signal of the first reference voltage terminal VGL is transmitted to the third node N2 via the tenth transistor T10, and the potential of the third node N2 is low. The second node N1*b* controls the seventh transistor T7 to be turned on, the low level signal of the first clock signal terminal OUT is transmitted to the first gate signal output terminal GOUT via the seventh transistor T7, thus the potential of the first gate signal output terminal GOUT is still low. The input node IN controls the ninth transistor T9 to be turned on, the low level signal of the first reference voltage terminal VGL is transmitted to the third node N2 via the ninth transistor T9, further ensuring that the potential of the third node N2 is low. Under the control of the third node N2, the eighth transistor T8 and the sixth transistor T6 are turned off. The low level signal of the second clock signal terminal RSTF is transmitted to the reset control terminal RST via the nineteenth transistor T19, and the potential of the reset control terminal RST is low. The reset control terminal RST controls the fourteenth transistor T14, the fifteenth transistor T15 and the fifth transistor T5 to be turned off, the first node N1*a* controls the fourth transistor to be turned on, and the low level signal of the first clock signal terminal OUT is transmitted to the second gate signal output terminal NEXT via the fourth transistor, thus the potential of the second gate signal output terminal NEXT is low. In this stage, the first node N1*a* and the second node N1*b* have high potentials, and the third node N2 has low potential.

In the t3 stage (i.e. the output stage), INF=0, SET=0, OUT=1, RSTF=0, RSTB=0, EN=1, GREST=0.

The signal of the reverse scanning input signal terminal INB controls the thirteenth transistor T13 to be turned off. The twelfth transistor T12 and the eleventh transistor T11 are turned off, the first node N1*a* is in a floating state, the potential of the first node N1*a* still remains a high potential, and the potential of the second node N1*b* is still a high potential by means of the first transistor T1. The first node N1*a* controls the tenth transistor T10 to be turned on, the low level signal of the first reference voltage terminal VGL is transmitted to the third node N2 via the tenth transistor T10, and the potential of the third node N2 is a low potential. The second node N1*b* controls the seventh transistor T7 to be turned on, the high-level signal of the first clock signal terminal OUT is transmitted to the first gate signal output terminal GOUT via the seventh transistor T7, thus the potential of the first gate signal output terminal GOUT becomes a high potential, and the signal of the first clock signal terminal OUT becomes a low potential at point a. Due to the bootstrap effect of the second capacitor C2, the potential of the second node is further pulled up, thereby ensuring the stability of output. The input node IN controls the ninth transistor T9 to be turned on, the low level signal of the first reference voltage terminal VGL is transmitted to the third node N2 via the ninth transistor T9, further ensuring that the potential of the third node N2 is low. Under the control of the third node N2, the eighth transistor T8 and the sixth transistor T6 are turned off. The low level signal of the second clock signal terminal RSTF is transmitted to the reset control terminal RST via the nineteenth transistor T19, and the potential of the reset control terminal RST is low. The reset control terminal RST controls the fourteenth transistor T14, the fifteenth transistor T15 and the fifth transistor T5 to be turned off, the first node N1*a* controls the fourth transistor to be turned on, and the high level signal of the first clock signal terminal OUT is transmitted to the second gate signal output terminal NEXT via the fourth transistor, thus the potential of the second gate signal output terminal NEXT is high. At this stage, the first node N1*a* and the second node N1*b* have high potentials, and the third node N2 has a low potential.

In addition, in the t3 stage (i.e., the output stage), the first clock signal terminal OUT is pulled down first. Due to the existence of the second capacitor C2, the potential of the second node N1*b* is pulled down to a normal high level at this time. The second node N1*b* controls the seventh transistor T7 to turn on, and the low potential of the first clock signal terminal OUT is transmitted to the first gate signal output terminal GOUT via the seventh transistor T7, thus the potential of the first gate signal output terminal GOUT becomes a low potential. Since the first clock signal terminal OUT is pulled down earlier than the first node N1*a*, the potential of the second gate signal output terminal NEXT will not be pulled down immediately, and it will be delayed that until RST is a high potential, the potential of the second gate signal output terminal NEXT becomes a low level.

In the t4 phase (i.e., the reset phase), INF=0, SET=0, OUT=0, RSTF=1, RSTB=0, EN=1, GREST=0.

The forward scanning control signal terminal U2D controls the nineteenth transistor T19 to turn on, the high level signal of the second clock signal terminal RSTF is transmitted to the reset control terminal RST via the nineteenth transistor T19, the reset control terminal RST controls the fourteenth transistor T14, the fifteenth transistor T15 and the fifth transistor T5 to turn on, the high level signal of the second reference voltage terminal VGH is transmitted to the third node N2 via the fifteenth transistor T15, the potential of the third node N2 becomes high potential, the third node N2 controls the eighth transistor T8 and the sixth transistor T6 to turn on, the low level signal of the first reference voltage terminal VGL is transmitted to the first node N1*a* via the eighth transistor T8, the potential of the first node N1*a* becomes low potential, and then transmitted to the second node N1*b* via the first transistor T1, the potential of the second node N1*b* becomes low potential. The first node N1*a* controls the tenth transistor T10 to turn off, and the second node N1*b* controls the seventh transistor T7 to turn off. The low level signal of the first reference voltage terminal VGL is transmitted to the first gate signal output terminal GOUT via the sixth transistor T6, and the potential of the first gate signal output terminal GOUT becomes low potential. The first node controls the fourth transistor T4 to be turned off, and the low level signal of the first reference voltage terminal VGL is transmitted to the second gate signal output terminal NEXT via the fifth transistor T5, thus the potential of the second gate signal output terminal NEXT is a low potential.

The forward scanning input signal terminal INF controls the twelfth transistor T12 to be turned off, the low level signal of the first node N1*a* is transmitted to the input node IN via the fourteenth transistor T14, the potential of the input node IN becomes low potential, and the first control terminal SET controls the eleventh transistor T11 to be turned off. In this stage, the first node N1*a* and the second node N1*b* have low potentials, and the third node N2 has a high potential.

After stage t4, until the forward scanning input signal is received again, the potentials of the first node N1*a* and the second node N1*b* remain low, the potential of the second node N2 remains high, and the potentials of the first gate signal output terminal GOUT and the second gate signal output terminal NEXT remain low.

In some embodiments, as shown in FIGS. 10 and 11, when the IC detects the occurrence of electrostatic discharge in the k+1th frame scanning the nth row, the third driving signal EN is a low level signal, and the first transistor T1 is controlled to be turned off, so that the output signal of the first gate signal output terminal GOUT and the output signal of the second gate signal output terminal NEXT can be controlled separately, the output signal (GOUT) of the current stage of shift register will not affect the input signal (NEXT) of the next stage of shift register. Then, the fourth driving signal GREST is set to a high-level signal to control the second transistor T2 and the third transistor T3 to be turned on. The low level signal of the first reference voltage terminal VGL is transmitted to the second node N1*b* and the first gate signal output terminal GOUT via the second transistor T2 and the third transistor T3, respectively, so that the second node N1*b* and the first gate signal output terminal GOUT are both low potentials. Until the nth row is scanned in the k+2th frame, the fourth driving signal GREST is first pulled down to a low level, and then the third driving signal EN is pulled up to a high level, so that the fourth driving signal GREST first controls the second transistor T2 and the third transistor T3 to be turned off, and then the third driving signal EN controls the first transistor T1 to be turned on, and the high potential of the first node N1*a* is transmitted to the second node N1*b*, and the first gate signal output terminal GOUT can be output normally.

In specific implementation, the working principle of the shift register during reverse scanning is similar to that during forward scanning, and will not be described in detail here.

Based on the same inventive concept, an embodiment of the present invention further provides a gate driving circuit, comprising a plurality of cascaded shift registers, wherein the shift register is the shift register provided by any of the above embodiments of the present invention.

Optionally, when the driving mode of the gate driving circuit is forward scanning driving, the second gate signal output terminal NEXT of the Nth shift register is electrically connected with the forward scanning input signal terminal INF of the N+2th shift register, and the signal output by the second gate signal output terminal NEXT of the Nth shift register is configured to drive the N+2th shift register, where N≥1; when the driving mode of the gate driving circuit is reverse scanning driving, the second gate signal output terminal NEXT of the M+2th shift register is electrically connected with the reverse scanning input signal terminal INB in the Mth shift register, and the signal output by the second gate signal output terminal NEXT of the M+2th shift register is configured to drive the Mth shift register, where M≥1; the high and low levels of the forward scanning input signal terminal INF and the reverse scanning input signal terminal INB are opposite.

The gate driving circuit provided in this embodiment can be applied to a display panel to drive a plurality of gate lines in the display panel.

Figure 12:
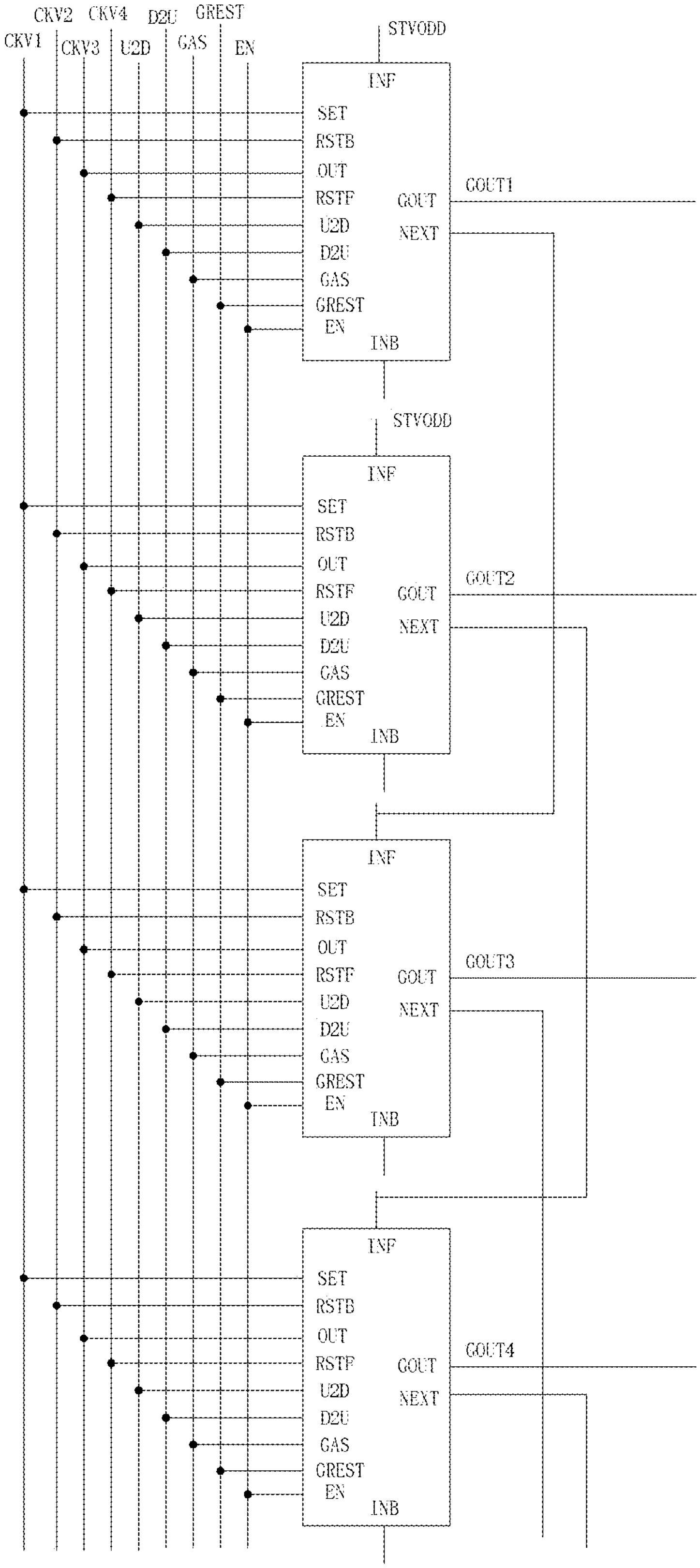
FIG. 12 is a schematic structural diagram of a unilaterally driven gate driving circuit provided by an embodiment of the present invention.

Optionally, as shown in FIG. 12, the forward scanning input signal terminal INF of the first stage of shift register is coupled to the forward scanning frame trigger signal terminal STV ODD; except for the first stage of shift register, the forward scanning input signal terminal INF of the nth stage of shift register is coupled to the second gate signal output terminal NEXT of the n−2th stage of shift register; the reverse scanning input signal terminal INB of the Nth stage of shift register is coupled to the second gate signal output terminal NEXT of the N−2th stage of shift register; where n is an integer greater than or equal to 1 and less than or equal to N−2. In this way, forward scanning driving can be realized.

Or, optionally, as shown in FIG. 12, in the gate driving circuit, the reverse scanning input signal terminal INB of the Nth stage of shift register is coupled to the reverse scanning frame trigger signal terminal; except for the Nth stage of shift register, the reverse scanning input signal terminal INB of the n−1th stage of shift register is coupled to the second gate signal output terminal NEXT of the nth stage of shift register; and the reverse scanning input signal terminal INB of the 1st stage of shift register is coupled to the second gate signal output terminal NEXT of the 2nd stage of shift register. In this way, reverse scanning driving can be realized.

Furthermore, in the gate driving circuit provided in the embodiment of the present invention, as shown in FIG. 12, four clock signal lines are further included: CKV1, CKV2, CKV3 and CKV4, the four clock signal lines are respectively connected with each stage of the shift register.

Figure 13:
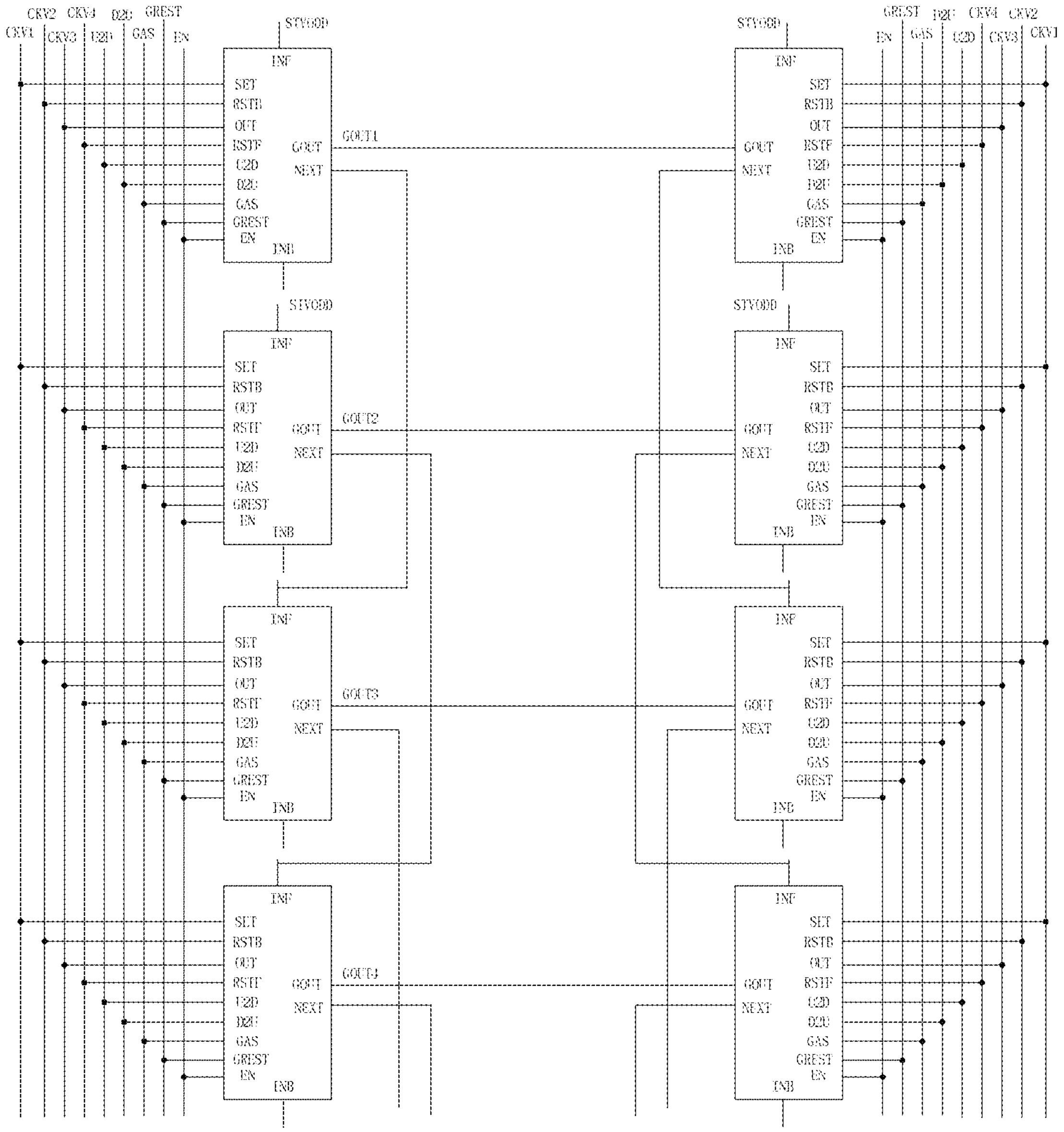
FIG. 13 is a schematic structural diagram of a double-sided driven gate driving circuit provided by an embodiment of the present invention.
Figure 14:
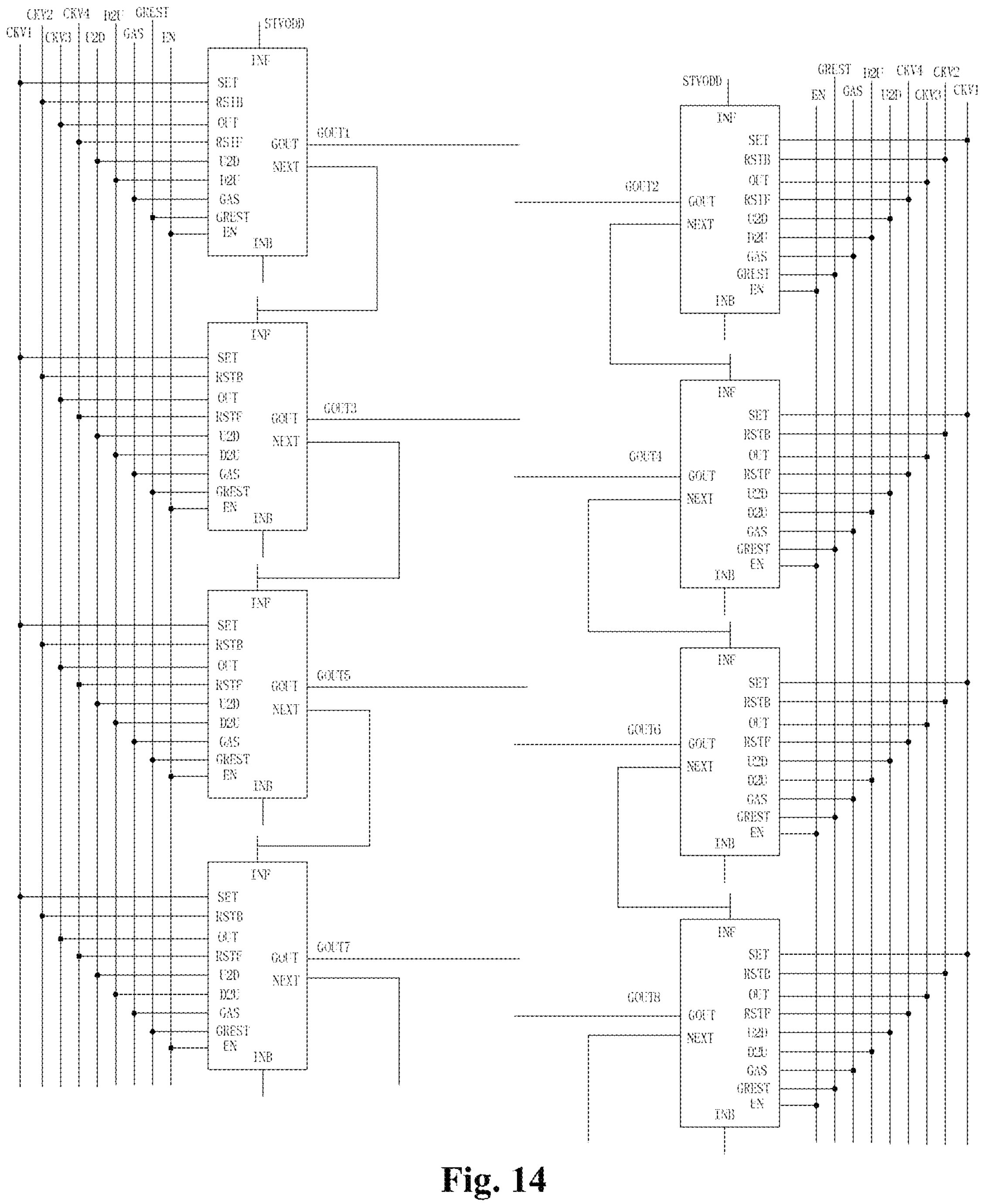
FIG. 14 is a schematic structural diagram of a cross-driven gate driving circuit provided by an embodiment of the present invention.

In some optional embodiments, the present invention not only supports unilaterally driven gate driving circuits, but also supports bilaterally driven and cross driven gate driving circuits, as shown in FIGS. 12, 13 and 14, FIG. 12 is a schematic diagram of a unilaterally driven gate driving circuit, FIG. 13 is a schematic diagram of a bilaterally driven gate driving circuit, and FIG. 14 is a schematic diagram of a cross-driven gate driving circuit.

Based on the same inventive concept, the present invention further provides a panel, comprising: an array substrate and an oppose substrate arranged opposite to each other; the array substrate comprises a base substrate and a shift register provided by any of the above embodiments of the present invention located on the base substrate. Wherein, the panel is a display apparatus.

Referring to FIGS. 12, 13, 14 and 15, it comprises: a display area AA and a non-display area BB; the display area AA comprises a plurality of gate lines G and a plurality of data lines S insulated and intersecting with the gate lines G; the non-display area BB comprises the driving circuit gr provided by any of the above embodiments of the present invention, and a first gate signal output terminal GOUT and a second gate signal output terminal NEXT of each shift register are electrically connected with a gate line G.

Figure 15:
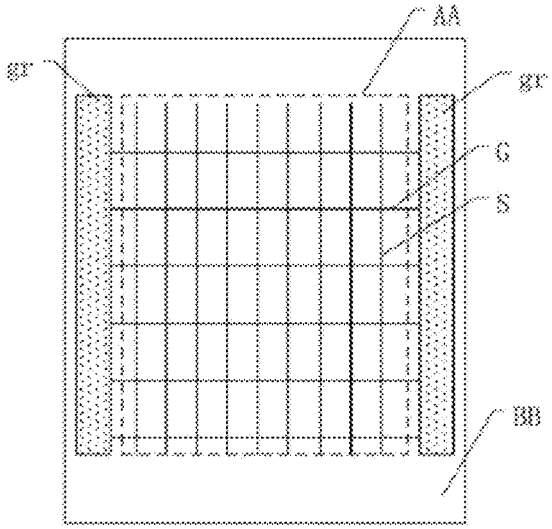
FIG. 15 is a schematic structural diagram of a panel provided by an embodiment of the present invention.

In a specific implementation, in the implementation of the present invention, the display apparatus may include two driving circuits. Optionally, as shown in FIG. 15, a shift register in each gate driving circuit is connected with a gate line in the display panel, and the shift registers of the same stage in the two gate driving circuits are connected with the same gate line. Alternatively, one driving circuit is connected with the gate lines of odd-numbered rows in the display panel, and the other driving circuit is connected with the gate lines of even-numbered rows in the display panel.

In a specific implementation, in the implementation of the present invention, the display apparatus may include one driving circuit.

The display apparatus provided in this embodiment may be an array substrate or a terminal display apparatus, such as a mobile phone, a computer, a television, or other display apparatus with display functions, and the present invention does not specifically limit this. The display apparatus provided in the embodiment of the present invention has the beneficial effects of the driving circuit provided in the embodiment of the present invention, and the details can be referred to the above embodiments. The specific description of the driving circuit is not repeated in this embodiment.

Figure 16:
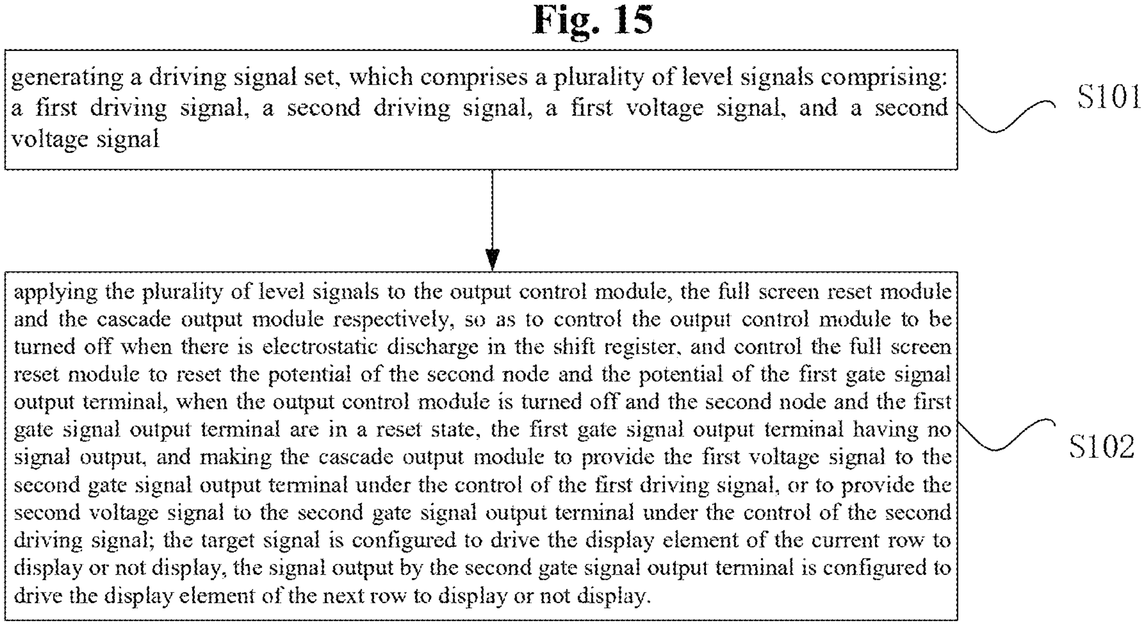
FIG. 16 is a schematic flow chart of a method for controlling a shift register provided by an embodiment of the present invention.

Based on the same inventive concept, the present invention further provides a method for controlling a shift register, the control method is configured to control the shift register provided by any of the above embodiments of the present invention, as shown in FIGS. 6 and 16, comprising:

Step S101: generating a driving signal set, which comprises a plurality of level signals comprising: a first driving signal, a second driving signal, a first voltage signal, and a second voltage signal;

Step S102, applying the plurality of level signals to the output control module, the full screen reset module and the cascade output module respectively, so as to control the output control module to be turned off when there is electrostatic discharge in the shift register, and control the full screen reset module to reset the potential of the second node N1*b* and the potential of the first gate signal output terminal GOUT, when the output control module is turned off and the second node N1*b* and the first gate signal output terminal GOUT are in a reset state, the first gate signal output terminal GOUT having no signal output, and making the cascade output module to provide the first voltage signal to the second gate signal output terminal NEXT under the control of the first driving signal, or to provide the second voltage signal to the second gate signal output terminal NEXT under the control of the second driving signal; wherein the target signal is configured to drive the display element of the current row to display or not display, and the signal output by the second gate signal output terminal NEXT is configured to drive the display element of the next row to display or not display.

Optionally, the output control module comprises a first transistor T1, and the full screen reset module 02 comprises a second transistor T2. A gate of the first transistor T1 is configured to input a third driving signal EN, a first electrode of the first transistor T1 is connected with the first node N1*a*, and a second electrode of the first transistor T1 is connected with the second node N1*b*, the third driving signal EN is configured to control the first transistor T1 to be turned on; a gate of the second transistor T2 is configured to input a fourth driving signal GREST, a first electrode of the second transistor T2 is connected with the second node N1*b*, and a second electrode of the second transistor T2 is connected with the first reference voltage terminal VGL; applying a plurality of level signals are respectively to the output control module and the full screen reset module to control the output control module to be turned off when there is electrostatic discharge in the shift register, and to control the full screen reset module to reset the potential of the second node N1*b* and the potential of the first gate signal output terminal GOUT comprises: applying the third driving signal EN to the gate of the first transistor T1, and applying the fourth driving signal GREST to the gate of the second transistor T2; wherein, when electrostatic discharge occurs in the kth frame and the current frame is the kth frame, the third driving signal EN is first adjusted to a low level signal to control the first transistor T1 to be turned off, and then the fourth driving signal GREST is adjusted to a high level signal to control the second transistor T2 to be turned on; when electrostatic discharge occurs in the kth frame and the current frame is the k+1th frame, the fourth driving signal GREST is first adjusted to a low level signal to control the second transistor T2 to be turned off, and then the third driving signal EN is adjusted to a high level signal to control the first transistor T1 to be turned on.

Optionally, the cascade output module comprises a fourth transistor T4 and a fifth transistor T5, and applying the plurality of level signals to the cascade output module so that when there is electrostatic release in the shift register, the cascade output module provides a first voltage signal to the second gate signal output terminal NEXT under the control of a first driving signal, or provides a second voltage signal to the second gate signal output terminal NEXT under the control of a second driving signal, comprises: applying the first driving signal to the gate of the fourth transistor T4, so that when the first driving signal is a low level signal, the fourth transistor T4 is turned off, and when the first driving signal is a high level signal, the fourth transistor T4 is turned on; applying the second driving signal to the gate of the fifth transistor T5, so that when the second driving signal is a low level signal, the fifth transistor T5 is turned off, and when the second driving signal is a high level signal, the fifth transistor T5 is turned on.

Optionally, the shift register comprises a reset control module configured to provide the signal of the second clock signal terminal RSTF to the reset control terminal RST under the control of the signal of the forward scanning control signal terminal U2D, or provide the signal of the third clock signal terminal RSTB to the reset control terminal RST under the control of the signal of the reverse scanning control signal terminal D2U, the reset control module comprises a nineteenth transistor T19 and a twentieth transistor T20, a gate of the nineteenth transistor T19 is connected with the forward scanning control signal terminal U2D, a first electrode of the nineteenth transistor T19 is connected with the reset control terminal RST, and a second electrode of the nineteenth transistor T19 is connected with the second clock signal terminal RSTF; a gate of the twentieth transistor T20 is connected with the reverse scanning control signal terminal D2U, a first electrode of the twentieth transistor T20 is connected with the reset control terminal RST, and a second electrode of the twentieth transistor T20 is connected with the third clock signal terminal RSTB. After the driving signal set is generated, the method further comprises: when the driving mode of any gate driving circuit is forward scanning driving, the signal input to the forward scanning control signal terminal U2D is a high level signal, and the signal input to the reverse scanning control signal terminal D2U is a low level signal, the nineteenth transistor T19 is turned on, and the twentieth transistor T20 is turned off; when the driving mode of the gate driving circuit is reverse scanning driving, the signal input to the forward scanning control signal terminal U2D is a low level signal, and the signal input to the reverse scanning control signal terminal D2U is a high level signal, the nineteenth transistor T19 is turned on, and the twentieth transistor T20 is turned on.

Figure 17:
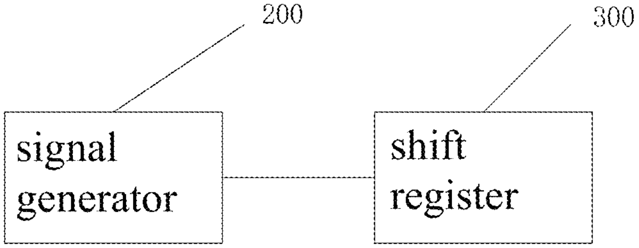
FIG. 17 is a schematic structural diagram of a shift register driving apparatus provided in an embodiment of the present invention.

Based on the same inventive concept, the present invention further provides a shift register driving apparatus, as shown in FIG. 17, comprising: a signal generator 200, configured to generate a driving signal set, and a shift register 300 provided by any of the above embodiments of the present invention, the signal in the driving signal set generated by the signal generator 200 is configured to input to the shift register 300.

The above-mentioned shift register provided in the embodiment of the present invention controls the output signal of the current stage of shift register and the input signal of the next stage of shift register respectively via the output control module, the full screen reset module, the cascade output module and the output module, so that the output signal of the current stage of shift register will not affect the input signal of the next stage of shift register, thereby solving the problem in the prior art that when static electricity is released in a certain row of the display screen, the output signal of this row will affect the input signal of the next row, thereby improving the phenomenon of abnormal split screen on the display screen.

Obviously, the skilled in the art can make various changes and modifications to the present invention without departing from the spirit and scope of the present invention. Thus, if these modifications and variations of the present invention fall within the scope of the claims of the present invention and their equivalents, the present invention is also intended to include these modifications and variations.

What is claimed is:

1. A shift register, comprising:

an output control module, a full screen reset module, a cascade output module and an output module that are electrically connected, wherein the output control module is configured to turn on when there is no electrostatic discharge in the shift register to transmit a signal of a first node to a second node so that a first gate signal output terminal outputs a target signal configured to drive a current row of display element to display or not display, or the output control module is configured to turn off when there is electrostatic discharge in the shift register;

the full screen reset module is configured to reset the potential of the second node and the potential of the first gate signal output terminal when there is electrostatic discharge in the shift register, the first gate signal output terminal not outputting any signal when the output control module is turned off and the second node and the first gate signal output terminal are in a reset state;

the cascade output module is configured to provide a first voltage signal to a second gate signal output terminal under the control of a first driving signal when there is electrostatic discharge in the shift register, or the cascade output module is configured to provide a second voltage signal to a second gate signal output terminal under the control of a second driving signal, a signal output by the second gate signal output terminal being configured to drive a next row of display element to display or not display;

the output module is configured to provide a signal of a first clock signal terminal to the first gate signal output terminal under the control of a signal of the second node, or the output module is configured to provide a signal of a first reference voltage terminal to the first gate signal output terminal under the control of a signal of a third node, or the output module is configured not to output any signal when the output control module is turned off.

2. The shift register of claim 1, further comprising a node control module, a node charging module, a scanning control module and a reset module that are electrically connected, wherein the node control module is configured to control a signal of the second node or the third node to control the level of the signal of the second node or the third node to be opposite;

the node charging module comprises a first control terminal and is configured to provide a signal of a input node to the third node under the control of a signal of the first control terminal;

the scanning control module is configured to provide a signal of a forward scanning control terminal to the input node under the control of a signal of a forward scanning input signal terminal, or the scanning control module is configured to provide a signal of a reverse scanning control signal terminal to the input node under the control of a signal of a reverse scanning input signal terminal;

the reset module comprises a reset control terminal and configured to reset the potential of the first node under the control of the reset control terminal, and provide a signal of a second reference voltage terminal to the third node.

3. The shift register of claim 2, wherein the node control module comprises an eighth transistor, a ninth transistor and a tenth transistor, a gate of the eighth transistor being connected with the third node, a first electrode of the eighth transistor being connected with the node charging module and the first node respectively, and a second electrode of the eighth transistor being connected with the first reference voltage terminal, a gate of the ninth transistor being connected with the input node, a first electrode of the ninth transistor being connected with the first reference voltage terminal, and a second electrode of the ninth transistor being connected with the gate of the eighth transistor and the third node respectively, a gate of the tenth transistor being connected with the first node, a first electrode of the tenth transistor being connected with the first reference voltage terminal, and a second electrode of the tenth transistor being connected with the third node.

4. The shift register of claim 2, wherein the node charging module comprises an eleventh transistor, a gate of the eleventh transistor being connected with the first control terminal, a first electrode of the eleventh transistor being connected with the first node, and a second electrode of the eleventh transistor being connected with the input node.

5. The shift register of claim 2, wherein the scan control module comprises a twelfth transistor and a thirteenth transistor, a gate of the twelfth transistor being connected with the forward scanning input signal terminal, a first electrode of the twelfth transistor being connected with the forward scanning control signal terminal, and a second electrode of the twelfth transistor being connected with the input node, a gate of the thirteenth transistor being connected with the reverse scanning input signal terminal, a first electrode of the thirteenth transistor being connected with the reverse scanning control signal terminal, and a second electrode of the thirteenth transistor being connected with the input node.

6. The shift register of claim 2, wherein the reset module comprises a fourteenth transistor and a fifteenth transistor, a gate of the fourteenth transistor being connected with the reset control terminal, a first electrode of the fourteenth transistor being connected with the first node, and a second electrode of the fourteenth transistor being connected with the input node, a gate of the fifteenth transistor being connected with the gate of the fourteenth transistor and the reset control terminal respectively, a first electrode of the fifteenth transistor being connected with the third node and a second electrode of the fifteenth transistor being connected with the second reference voltage terminal.

7. The shift register of claim 1, further comprising a discharge module and a reset control module that are electrically connected, wherein the discharge module comprises a discharge control terminal and is configured to provide a signal of a first reference voltage terminal to the first node and the third node respectively, and provide a signal of a second reference voltage terminal or a signal of the discharge control terminal to the first gate signal output terminal under the control of the discharge control terminal;

the reset control module is configured to provide a signal of a second clock signal terminal to the reset control terminal under the control of a signal of a forward scanning control signal terminal, or the reset control module is configured to provide a signal of a third clock signal terminal to the reset control terminal under the control of a signal of a reverse scanning control signal terminal.

8. The shift register of claim 7, wherein the discharge module comprises a sixteenth transistor, a seventeenth transistor and an eighteenth transistor, a gate of the sixteenth transistor being connected with the discharge control terminal, a first electrode of the sixteenth transistor being connected with the first node, and a second electrode of the sixteenth transistor being connected with the first reference voltage terminal, a gate of the seventeenth transistor being connected with the discharge control terminal, a first electrode of the seventeenth transistor being connected with the third node, and a second electrode of the seventeenth transistor being connected with the first reference voltage terminal, a gate of the eighteenth transistor being connected with the discharge control terminal, a first electrode of the eighteenth transistor being connected with the first gate signal output terminal, and a second terminal of the eighteenth transistor being connected with the discharge control terminal.

9. The shift register of claim 7, wherein the reset control module comprises a nineteenth transistor and a twentieth transistor, a gate of the nineteenth transistor being connected with the forward scanning control signal terminal, a first electrode of the nineteenth transistor being connected with the reset control terminal, and a second electrode of the nineteenth transistor being connected with the second clock signal terminal, a gate of the twentieth transistor being connected with the reverse scanning control signal terminal, a first electrode of the twentieth transistor being connected with the reset control terminal, and a second electrode of the twentieth transistor being connected with the third clock signal terminal.

10. The shift register of claim 1, wherein the output control module comprises a first transistor, and the full screen reset module comprises a second transistor and a third transistor, a gate of the first transistor being configured to input a third driving signal configured to control the first transistor to be turned on, a first electrode of the first transistor being connected with the first node and a second electrode of the first transistor being connected with the second node, a gate of the second transistor being configured to input a fourth driving signal, a first electrode of the second transistor being connected with the second node and a second electrode of the second transistor being connected with the first reference voltage terminal;

a gate of the third transistor being configured to input the fourth driving signal, a first electrode of the third transistor being electrically connected with the first gate signal output terminal and a second electrode of the third transistor being connected with the first reference voltage terminal.

11. The shift register of claim 1, wherein the cascade output module comprises a fourth transistor and a fifth transistor, a gate of the fourth transistor being connected with the first node, a first electrode of the fourth transistor being connected with the second gate signal output terminal and a second electrode of the fourth transistor being connected with the first clock signal terminal, a gate of the fifth transistor being connected with a reset control terminal, a first electrode of the fifth transistor being connected with the first reference voltage terminal and a second electrode of the fifth transistor being connected with the second gate signal output terminal.

12. The shift register of claim 1, wherein the cascade output module comprises a fourth transistor and a fifth transistor, a gate of the fourth transistor being connected with the first node, a first electrode of the fourth transistor being connected with the second gate signal output terminal and a second electrode of the fourth transistor being connected with the first clock signal terminal, a gate of the fifth transistor being connected with the third node, a first electrode of the fifth transistor being connected with the first reference voltage terminal and a second electrode of the fifth transistor being connected with the second gate signal output terminal.

13. The shift register of claim 1, wherein the cascade output module comprises a fourth transistor and a fifth transistor, a gate of the fourth transistor being connected with the first clock signal terminal, a first electrode of the fourth transistor being connected with the first node and a second electrode of the fourth transistor being connected with the second gate signal output terminal, a gate of the fifth transistor being connected with the reset control terminal, a first electrode of the fifth transistor being connected with the first reference voltage terminal and a second electrode of the fifth transistor being connected with the second gate signal output terminal.

14. The shift register of claim 1, wherein the output module comprises a sixth transistor, a seventh transistor, a first capacitor and a second capacitor, a gate of the sixth transistor being connected with the third node, a first electrode of the sixth transistor being connected with the first reference voltage terminal and a second electrode of the sixth transistor being connected with the first gate signal output terminal, a gate of the seventh transistor being connected with the second node, a first electrode of the seventh transistor being connected with the second electrode of the sixth transistor and the first gate signal output terminal, respectively, and a second electrode of the seventh transistor being connected with the first clock signal terminal, a first electrode of the first capacitor being connected with the first reference voltage terminal, and a second electrode of the first capacitor being connected with the third node and the gate of the sixth transistor, respectively, a first electrode of the second capacitor being connected with the second node and the gate of the seventh transistor, respectively, and a second electrode of the second capacitor being connected with the first gate signal output terminal.

15. A gate driving circuit, comprising:

a plurality of shift registers that are cascaded, wherein the shift registers each comprises:

an output control module, a full screen reset module, a cascade output module and an output module that are electrically connected, wherein the output control module is configured to turn on when there is no electrostatic discharge in the shift register to transmit a signal of a first node to a second node so that a first gate signal output terminal outputs a target signal configured to drive a current row of display element to display or not display, or the output control module is configured to turn off when there is electrostatic discharge in the shift register;

the full screen reset module is configured to reset the potential of the second node and the potential of the first gate signal output terminal when there is electrostatic discharge in the shift register, the first gate signal output terminal not outputting any signal when the output control module is turned off and the second node and the first gate signal output terminal are in a reset state;

the cascade output module is configured to provide a first voltage signal to a second gate signal output terminal under the control of a first driving signal when there is electrostatic discharge in the shift register, or the cascade output module is configured to provide a second voltage signal to a second gate signal output terminal under the control of a second driving signal, a signal output by the second gate signal output terminal being configured to drive a next row of display element to display or not display;

the output module is configured to provide a signal of a first clock signal terminal to the first gate signal output terminal under the control of a signal of the second node, or the output module is configured to provide a signal of a first reference voltage terminal to the first gate signal output terminal under the control of a signal of a third node, or the output module is configured not to output any signal when the output control module is turned off.

16. The gate driving circuit of claim 15, wherein when the driving mode of the gate driving circuit is forward scanning driving, a second gate signal output terminal of the Nth shift register is electrically connected with a forward scanning input signal terminal of the N+2th shift register, and a signal output by the second gate signal output terminal of the Nth shift register is configured to drive the N+2th shift register, where N≥1;

when the driving mode of the gate driving circuit is reverse scanning driving, a second gate signal output terminal of the M+2th shift register is electrically connected with a reverse scanning input signal terminal of the Mth shift register, and a signal output by the second gate signal output terminal of the M+2th shift register is configured to drive the Mth shift register, where M≥1;

high and low levels of the forward scanning input signal terminal and the reverse scanning input signal terminal are opposite.

17. A method for controlling a shift register and used to control the shift register comprising:

an output control module, a full screen reset module, a cascade output module and an output module that are electrically connected, wherein the output control module is configured to turn on when there is no electrostatic discharge in the shift register to transmit a signal of a first node to a second node so that a first gate signal output terminal outputs a target signal configured to drive a current row of display element to display or not display, or the output control module is configured to turn off when there is electrostatic discharge in the shift register;

the full screen reset module is configured to reset the potential of the second node and the potential of the first gate signal output terminal when there is electrostatic discharge in the shift register, the first gate signal output terminal not outputting any signal when the output control module is turned off and the second node and the first gate signal output terminal are in a reset state;

the cascade output module is configured to provide a first voltage signal to a second gate signal output terminal under the control of a first driving signal when there is electrostatic discharge in the shift register, or the cascade output module is configured to provide a second voltage signal to a second gate signal output terminal under the control of a second driving signal, a signal output by the second gate signal output terminal being configured to drive a next row of display element to display or not display;

the output module is configured to provide a signal of a first clock signal terminal to the first gate signal output terminal under the control of a signal of the second node, or the output module is configured to provide a signal of a first reference voltage terminal to the first gate signal output terminal under the control of a signal of a third node, or the output module is configured not to output any signal when the output control module is turned off, the method comprising:

generating a driving signal set, which comprises a plurality of level signals comprising: a first driving signal, a second driving signal, a first voltage signal, and a second voltage signal;

applying a plurality of the level signals to an output control module, a full screen reset module and a cascade output module respectively, so as to control the output control module to be turned off when there is electrostatic discharge in the shift register, control the full screen reset module to reset the potential of a second node and the potential of a first gate signal output terminal, the first gate signal output terminal having no signal output when the output control module is turned off and the second node and the first gate signal output terminal are in a reset state, as well as to make the cascade output module to provide the first voltage signal to the second gate signal output terminal under the control of the first driving signal, or to provide the second voltage signal to the second gate signal output terminal under the control of the second driving signal, wherein the target signal is configured to drive a current row of display elements to display or not display, and a signal output by the second gate signal output terminal is configured to drive a next row of display elements to display or not display.

18. The method of claim 17, wherein the output control module comprises a first transistor, and the full screen reset module comprises a second transistor, a gate of the first transistor being configured to input a third driving signal configured to control the first transistor to be turned on, a first electrode of the first transistor being connected with the first node, a second electrode of the first transistor being connected with the second node, a gate of the second transistor being configured to input a fourth driving signal, a first electrode of the second transistor being connected with the second node, a second electrode of the second transistor being connected with the first reference voltage terminal;

applying a plurality of the level signals to the output control module and the full screen reset module respectively, so as to control the output control module to be turned off when there is electrostatic discharge in the shift register, and control the full screen reset module to reset the potential of a second node and the potential of a first gate signal output terminal comprises applying the third driving signal to the gate of the first transistor, and applying the fourth driving signal to the gate of the second transistor;

when electrostatic discharge occurs in the kth frame and the current frame is the kth frame, the third driving signal is first adjusted to a low level signal to control the first transistor to be turned off, and then the fourth driving signal is adjusted to a high level signal to control the second transistor to be turned on;

when electrostatic discharge occurs in the kth frame and the current frame is the k+1th frame, the fourth driving signal is first adjusted to a low level signal to control the second transistor to be turned off, and then the third driving signal is adjusted to a high level signal to control the first transistor to be turned on.

19. The method of claim 17, wherein the cascade output module comprises a fourth transistor and a fifth transistor;

applying a plurality of the level signals to the cascade output module, so as to make the cascade output module to provide the first voltage signal to the second gate signal output terminal under the control of the first driving signal, or provide the second voltage signal to the second gate signal output terminal under the control of the second driving signal when electrostatic discharge occurs in the shift register comprises:

applying the first driving signal to the gate of the fourth transistor, so that when the first driving signal is a low level signal, the fourth transistor is turned off, and when the first driving signal is a high level signal, the fourth transistor is turned on;

applying the second driving signal to the gate of the fifth transistor, so that when the second driving signal is a low level signal, the fifth transistor is turned off, and when the second driving signal is a high level signal, the fifth transistor is turned on.

20. The method of claim 17, wherein the shift register comprises a reset control module configured to provide a signal of the second clock signal terminal to the reset control terminal under the control of a signal of the forward scanning control signal terminal, or to provide a signal of the third clock signal terminal to the reset control terminal under the control of a signal of the reverse scanning control signal terminal, the reset control module comprises a nineteenth transistor and a twentieth transistor, a gate of the nineteenth transistor being connected with the forward scanning control signal terminal, a first electrode of the nineteenth transistor being connected with the reset control terminal, and a second electrode of the nineteenth transistor being connected with the second clock signal terminal, a gate of the twentieth transistor being connected with the reverse scanning control signal terminal, a first electrode of the twentieth transistor being connected with the reset control terminal, and a second electrode of the twentieth transistor being connected with the third clock signal terminal;

after the driving signal set is generated, when the driving mode of the gate driving circuit comprising the shift register is forward scanning driving, a signal input to the forward scanning control signal terminal is a high level signal, a signal input to the reverse scanning control signal terminal is a low level signal, the nineteenth transistor is turned on, and the twentieth transistor is turned off;

when the driving mode of the gate driving circuit is reverse scanning driving, the signal input to the forward scanning control signal terminal is a low level signal, the signal input to the reverse scanning control signal terminal is a high level signal, the nineteenth transistor is turned off, and the twentieth transistor is turned on.

* * * * *